(12) United States Patent
Han

(10) Patent No.: US 12,114,485 B2
(45) Date of Patent: Oct. 8, 2024

(54) SEMICONDUCTOR STRUCTURE AND METHOD FOR MANUFACTURING SAME

(71) Applicant: CHANGXIN MEMORY TECHNOLOGIES, INC., Anhui (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 371 days.

(21) Appl. No.: 17/669,573

(22) Filed: Feb. 11, 2022

(65) Prior Publication Data

US 2023/0020711 A1 Jan. 19, 2023

Related U.S. Application Data

(63) Continuation of application No. PCT/CN2021/117284, filed on Sep. 8, 2021.

(30) Foreign Application Priority Data

Jul. 16, 2021 (CN) .......................... 202110808697.5

(51) Int. Cl.
*H10B 12/00* (2023.01)
*H01L 29/10* (2006.01)
(Continued)

(52) U.S. Cl.
CPC ....... *H10B 12/482* (2023.02); *H01L 29/1041* (2013.01); *H01L 29/42392* (2013.01);
(Continued)

(58) Field of Classification Search
None
See application file for complete search history.

(56) References Cited

U.S. PATENT DOCUMENTS 5,627,390 A 5/1997 Maeda
5,990,509 A 11/1999 Burns, Jr.
(Continued)

FOREIGN PATENT DOCUMENTS

CN 101572258 A 11/2009
CN 101908553 A 12/2010
(Continued)

OTHER PUBLICATIONS

Supplementary European Search Report in the European application No. 21884120.3, mailed on Dec. 8, 2022, 8 pgs.
(Continued)

*Primary Examiner* — Scott B Geyer
(74) *Attorney, Agent, or Firm* — Kilpatrick Townsend & Stockton LLP

(57) ABSTRACT

Provided are a semiconductor structure and a method for manufacturing the same. The semiconductor structure includes: a base; a bit line; and a semiconductor channel including a first doped region, a channel region, and a second doped region that are sequentially arranged, where the first doped region contacts the bit line, and the first doped region, the channel region, and the second doped region are doped with first-type doped ions. The channel region is further doped with second-type doped ions, enabling a concentration of majority carriers in the channel region to be less than a concentration of majority carriers in the first doped region and a concentration of majority carriers in the second doped region. The first-type doped ions are one of N-type ions or P-type ions, and the second-type doped ions are the other of N-type ions or P-type ions.

20 Claims, 36 Drawing Sheets

(51) Int. Cl.
*H01L 29/423* (2006.01)
*H01L 29/786* (2006.01)

(52) U.S. Cl.
CPC ....... *H01L 29/78696* (2013.01); *H10B 12/30* (2023.02); *H10B 12/488* (2023.02)

(56) References Cited

U.S. PATENT DOCUMENTS

| | | | |
|---|---|---|---|
| 6,040,210 A | 3/2000 | Burns, Jr. | |
| 6,114,725 A | 9/2000 | Furukawa | |
| 6,261,886 B1* | 7/2001 | Houston | H10B 12/05 257/E21.654 |
| 6,440,801 B1 | 8/2002 | Furukawa | |
| 7,015,526 B2* | 3/2006 | Bonart | H10B 12/0383 257/305 |
| 7,355,230 B2 | 4/2008 | Thies | |
| 7,564,084 B2 | 7/2009 | Song | |
| 7,781,773 B2 | 8/2010 | Thies | |
| 7,968,876 B2 | 6/2011 | Lung | |
| 8,313,979 B2 | 11/2012 | Lung | |
| 8,399,342 B2 | 3/2013 | Kim | |
| 8,624,236 B2 | 1/2014 | Lung et al. | |
| 8,742,493 B2 | 6/2014 | Kim | |
| 9,023,723 B2 | 5/2015 | Chang | |
| 9,136,376 B2 | 9/2015 | Moon et al. | |
| 9,431,402 B2 | 8/2016 | Ji | |
| 10,361,206 B2 | 7/2019 | Moon et al. | |
| 10,629,615 B1 | 4/2020 | Hu | |
| 10,892,262 B2 | 1/2021 | Moon et al. | |
| 10,950,608 B2 | 3/2021 | Moon et al. | |
| 2006/0113587 A1 | 6/2006 | Thies | |
| 2007/0051994 A1 | 3/2007 | Song | |
| 2007/0166914 A1* | 7/2007 | Chen | H10B 12/053 257/E21.655 |
| 2008/0150012 A1 | 6/2008 | Thies | |
| 2009/0194814 A1 | 8/2009 | Sugioka | |
| 2009/0273088 A1 | 11/2009 | Chung | |
| 2010/0052029 A1 | 3/2010 | Huang | |
| 2010/0295106 A1 | 11/2010 | Huang | |
| 2010/0295123 A1 | 11/2010 | Lung | |
| 2011/0217818 A1 | 9/2011 | Lung | |
| 2012/0052674 A1 | 3/2012 | Lee | |
| 2012/0064704 A1 | 3/2012 | Kim | |
| 2012/0080725 A1* | 4/2012 | Manos | H10B 61/22 257/329 |
| 2012/0104491 A1* | 5/2012 | Heineck | H10B 12/053 257/334 |
| 2012/0119286 A1 | 5/2012 | Kim | |
| 2012/0156844 A1 | 6/2012 | Kim | |
| 2012/0156868 A1 | 6/2012 | Kim et al. | |
| 2013/0037879 A1* | 2/2013 | Filippini | H10B 12/10 257/330 |
| 2013/0056699 A1 | 3/2013 | Lung | |
| 2013/0099305 A1* | 4/2013 | Kim | H10B 12/053 257/329 |
| 2013/0161710 A1 | 6/2013 | Ji | |
| 2013/0187279 A1* | 7/2013 | Surthi | H01L 21/76897 257/E23.06 |
| 2013/0234240 A1 | 9/2013 | Moon et al. | |
| 2013/0323920 A1 | 12/2013 | Chang et al. | |
| 2015/0348976 A1 | 12/2015 | Moon et al. | |
| 2016/0013292 A1 | 1/2016 | Choi | |
| 2016/0284712 A1 | 9/2016 | Liaw | |
| 2019/0074363 A1 | 3/2019 | Zhu | |
| 2019/0157345 A1 | 5/2019 | Zhu et al. | |
| 2019/0252387 A1 | 8/2019 | Moon et al. | |
| 2019/0273081 A1 | 9/2019 | Moon et al. | |
| 2020/0258895 A1 | 8/2020 | Xiao et al. | |
| 2020/0295011 A1* | 9/2020 | Sandhu | H10B 12/34 |
| 2021/0013210 A1 | 1/2021 | Lee et al. | |
| 2021/0028174 A1 | 1/2021 | Lee | |
| 2021/0066319 A1 | 3/2021 | Chang et al. | |
| 2021/0376157 A1* | 12/2021 | Doornbos | H01L 29/0673 |
| 2022/0415897 A1* | 12/2022 | Alzate-Vinasco | H01L 29/66742 |
| 2023/0018869 A1* | 1/2023 | Chuang | H01L 29/78642 |

FOREIGN PATENT DOCUMENTS

| | | |
|---|---|---|
| CN | 102543847 A | 7/2012 |
| CN | 103311249 A | 9/2013 |
| CN | 103311249 B | 5/2017 |
| CN | 108461496 A | 8/2018 |
| CN | 108493188 A | 9/2018 |
| CN | 208127209 U | 11/2018 |
| CN | 109285836 A | 1/2019 |
| CN | 109461738 A | 3/2019 |
| CN | 208655642 U | 3/2019 |
| CN | 110957319 A | 4/2020 |
| CN | 111354738 A | 6/2020 |
| CN | 111415945 A | 7/2020 |
| CN | 211719592 U | 10/2020 |
| CN | 112447734 A | 3/2021 |
| JP | H10229175 A | 8/1998 |
| JP | 2009182105 A | 8/2009 |
| JP | 2011097001 A | 5/2011 |
| JP | 2012142548 A | 7/2012 |
| JP | 2018163907 A | 10/2018 |
| KR | 20070047572 A | 5/2007 |
| KR | 20090068713 A | 6/2009 |
| KR | 20090132298 A | 12/2009 |
| KR | 20100002675 A | 1/2010 |
| KR | 20140011570 A | 1/2014 |
| KR | 20160142803 A | 12/2016 |
| KR | 20170109170 A | 9/2017 |
| KR | 20210044282 A | 4/2021 |
| TW | 201919155 A | 5/2019 |
| WO | 2018182720 A1 | 10/2018 |

OTHER PUBLICATIONS

Supplementary European Search Report in the European application No. 21870544.0, mailed on Dec. 13, 2022, 7 pgs.
International Search Report in the international application No. PCT/CN2021/117284, mailed on Mar. 29, 2022, 2 pgs.
International Search Report in the international application No. PCT/CN2021/128087, mailed on Mar. 28, 2022, 2 pgs.
International Search Report in the international application No. PCT/CN2021/121617, mailed on Mar. 3, 2022, 2 pgs.
International Search Report in the international application No. PCT/CN2022/076372, mailed on Apr. 28, 2022, 2 pgs.
Japanese Patent Office, office action issued in Application No. 2023-527715, May 28, 2024, 9 pages.
Korean Intellectual Property Office, Notice of Preliminary Rejection Issued in Application No. 10-2023-7018424, Jun. 19, 2024, 10 pages.
Korean Intellectual Property Office, Notice of Preliminary Rejection Issued in Application No. 10-2023-7019813, Jun. 24, 2024, 16 pages.
Japanese Patent Office, office action issued in Application No. 2023-532840, Jun. 25, 2024, 5 pages.
Non-Final Office Action of the U.S. Appl. No. 17/659,062, issued on Aug. 25, 2022, 18 pgs.
Non-Final Office Action of the U.S. Appl. No. 17/648,732, issued on Aug. 25, 2022, 23 pgs.
First Office Action of the Taiwanese application No. 111121996, issued on Nov. 18, 2022 4 pgs.
European Patent Office, Extended European Search Report Issued in Application No. 21949873.0, Jul. 29, 2024, Germany, 8 pages.
Japanese Patent Office, Office Action issued in Application No. 2023-535049, Aug. 6, 2024, 10 pages.

* cited by examiner

SEMICONDUCTOR STRUCTURE AND METHOD FOR MANUFACTURING SAME

CROSS-REFERENCE TO RELATED APPLICATIONS

This application is a continuation application of International Application No. PCT/CN2021/117284, filed on Sep. 8, 2021, which claims priority to Chinese Patent Application No. 202110808697.5, filed on Jul. 16, 2021. The disclosures of International Application No. PCT/CN2021/117284 and Chinese Patent Application No. 202110808697.5 are hereby incorporated by reference in their entireties.

BACKGROUND

As the integration density of dynamic memories becomes increasingly high, while an arrangement manner of transistors in dynamic memory array structures and how to reduce the sizes of individual functional devices in the dynamic memory array structures are being researched, there is also a need to improve the electrical performance of small-sized functional devices.

When a vertical Gate-All-Around (GAA) transistor structure is used as an access transistor of a dynamic memory, an area occupied by it may reach 4F2 (F: the minimum pattern size that can be obtained with a given process condition), which enables a higher density efficiency to be achieved in principle. However, restricted by a doping process, majority carriers in regions in the GAA transistor structure have consistent or slightly different concentrations. Therefore, it is difficult to adjust concentrations of the majority carriers in the regions in the GAA transistor structure to be different, and thus it is difficult to further improve the electrical performance of the GAA transistor structure and the dynamic memory.

SUMMARY

Embodiments of the disclosure relate to, but not limited to, a semiconductor structure and a method for manufacturing the same.

According to some embodiments of the disclosure, an aspect of the embodiments of the disclosure provides a semiconductor structure, including: a base; bit lines, located on the base; and semiconductor channels, located on surfaces of the bit lines. In a direction from the base to the bit lines, a semiconductor channel includes a first doped region, a channel region, and a second doped region that are sequentially arranged. The first doped region contacts a corresponding bit line, and the first doped region, the channel region, and the second doped region are doped with first-type doped ions. The channel region is further doped with second-type doped ions, enabling a concentration of majority carriers in the channel region is less than concentrations of majority carriers in the first doped region and the second doped region. The first-type doped ions are one of N-type ions or P-type ions, and the second-type doped ions are the other of P-type ions or N-type ions.

According to some embodiments of the disclosure, another aspect of the embodiments of the disclosure further provides a method for manufacturing a semiconductor structure, including: providing a base; forming initial bit lines on the base, and forming semiconductor channels on surfaces of the initial bit lines away from the base, where in a direction from the base to the initial bit lines, each semiconductor channel includes a first doped region, a channel region, and a second doped region that are sequentially arranged, and are doped with first-type doped ions at a same doping concentration which are one of N-type ions or P-type ions; forming a sacrifice layer doped with second-type doped ions on a sidewall of the channel region, which at least covers the sidewall of the channel region, where the second-type doped ions are the other of N-type ions or P-type ions; diffusing the second-type doped ions into the channel region by an annealing process, to reduce a concentration of majority carriers in the channel region; and removing the sacrifice layer, to expose the sidewall of the channel region.

BRIEF DESCRIPTION OF THE DRAWINGS

One or more embodiments are exemplarily described by a diagram that corresponds to the one or more embodiments in the accompanying drawings. These exemplary descriptions do not constitute a limitation to the embodiments. Unless specifically indicated, the diagrams in the accompanying drawings do not constitute any scale limitations.

DETAILED DESCRIPTION

Figure 1:
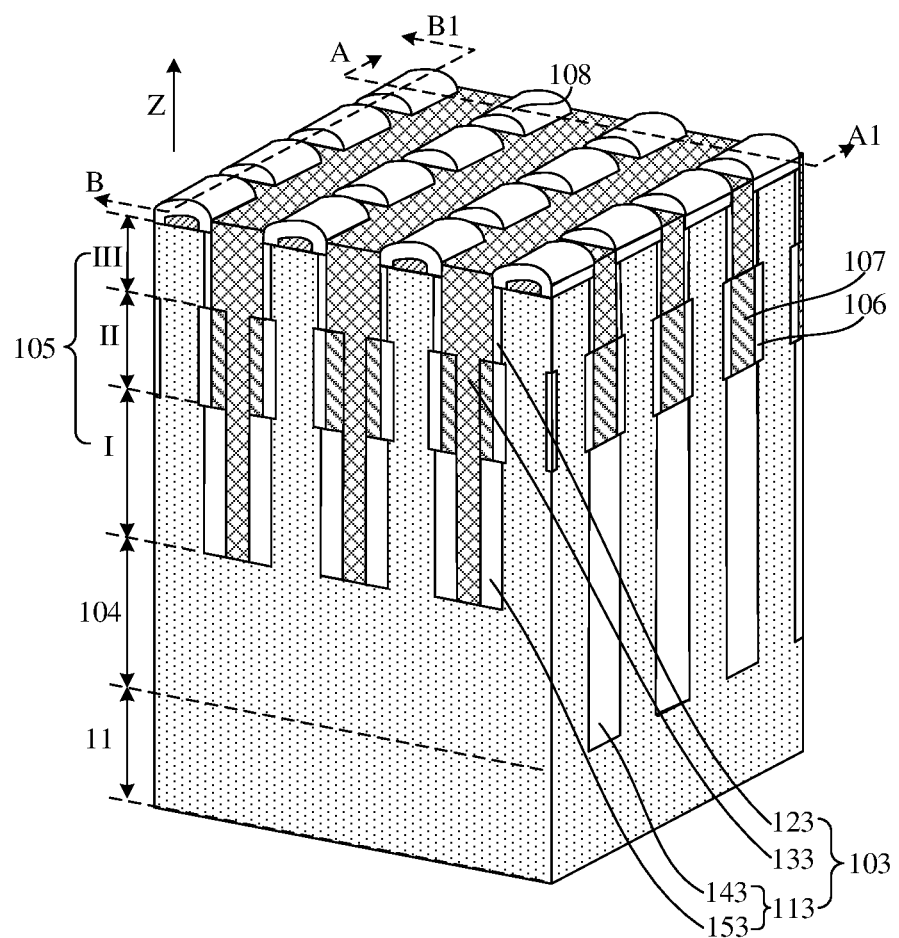
FIG. 1 to FIG. 36 are schematic structural diagrams corresponding to the steps in a method for forming a semiconductor structure according to embodiments of the disclosure.

Currently, the electrical performance of a semiconductor structure needs to be improved.

It is found through analysis that in a GAA transistor, a first doped region, a channel region, and a second doped region are sequentially stacked, making it difficult to perform a self-aligned doping process on the first doped region and the second doped region by an ion implantation process after a gate structure is manufactured as in a planar transistor. Therefore, the first doped region, the channel region, and the second doped region in the GAA transistor are usually formed by a same doping process. Accordingly, concentrations of majority carriers in the first doped region, the channel region, and the second doped region are basically consistent. Moreover, the concentration of majority carriers in the channel region should not be too high. When the concentration of majority carriers in the channel region is relatively high, the on/off ratio of the channel region is reduced, making it difficult for a gate to control the off of the channel region. However, when it is ensured that the concentration of majority carriers in the channel region satisfies that the channel region has a high on/off ratio, the concentrations of majority carriers in the first doped region and the second doped region are relatively low in this case, and thus the first doped region and the second doped region have relatively high resistances. As a result, a threshold voltage of the GAA transistor is increased, and a saturation current of the GAA transistor is reduced, causing an adverse impact to the electrical performance of the GAA transistor.

Embodiments of the disclosure provide a semiconductor structure and a method for manufacturing the same. In the semiconductor structure, the channel region is doped with both first-type doped ions and second-type doped ions, so that a concentration of majority carriers in the channel region is less than concentrations of majority carriers in the first doped region and the second doped region. In one aspect, the concentration of majority carriers in the channel region is relatively low, which helps to increase the on/off ratio of the channel region, thereby facilitating the improvement of the sensitivity of controlling on/off of the channel region, to ensure that the channel region can be quickly turned on or off. In another aspect, the concentrations of majority carriers in the first doped region and the second doped region are both relatively large, which helps to reduce resistances of the first doped region and the second doped region, thereby helping to reduce a threshold voltage of a transistor formed by the first doped region, the channel region and the second doped region, and increase a saturation current of the transistor. Therefore, the embodiments of the disclosure help to ensure that the concentration of majority carriers in the channel region is relatively low, while ensuring that the concentrations of majority carriers in the first doped region and the second doped region are relatively high, thereby improving the electrical performance of a semiconductor structure.

In order to make the objectives, technical solutions, and advantages of the embodiments of the disclosure clearer, the embodiments of the disclosure are described in detail below with reference to the accompanying drawings. However, it is understandable to those of ordinary skill in the art that many technical details are provided for a reader to better understand the disclosure in the embodiments of the disclosure. However, even in the absence of these technical details and various changes and modifications based on the following embodiments, the technical solution claimed in the disclosure can be implemented.

Figure 2:
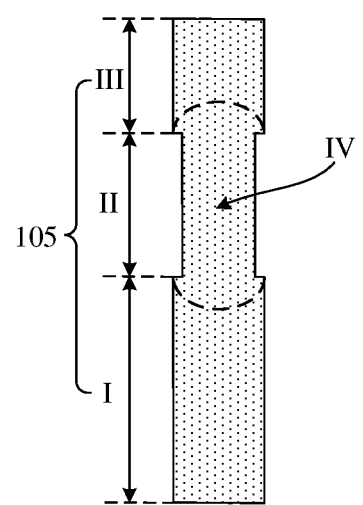
Figure 3:
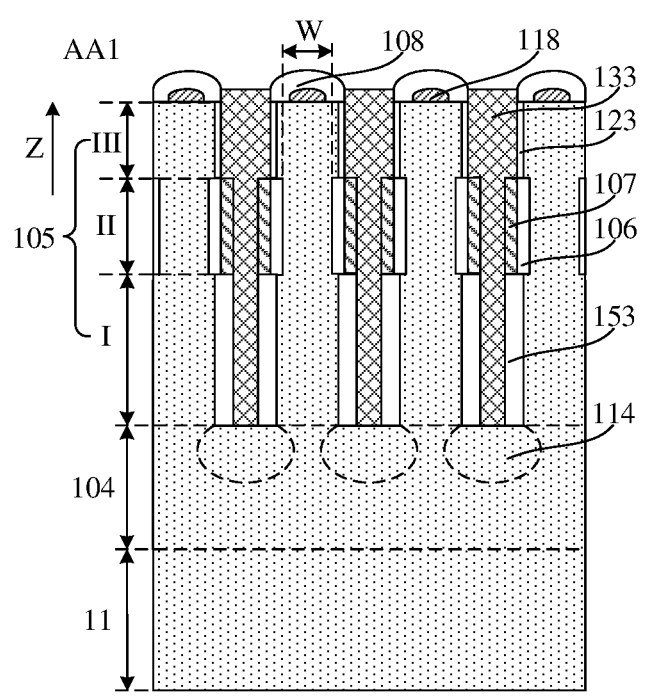
Figure 4:
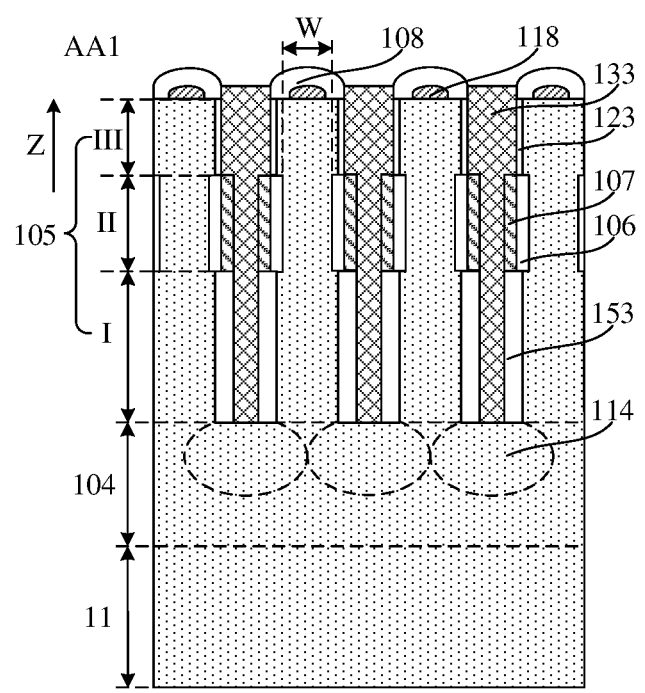
Figure 5:
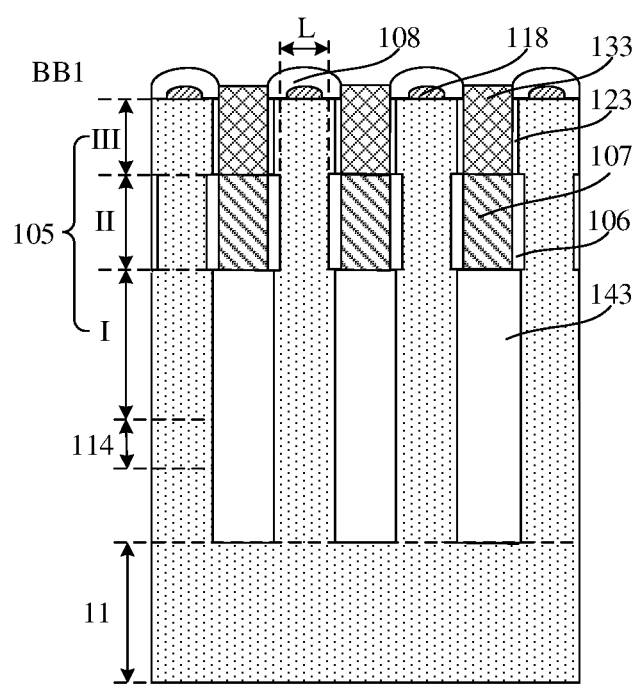
Figure 6:
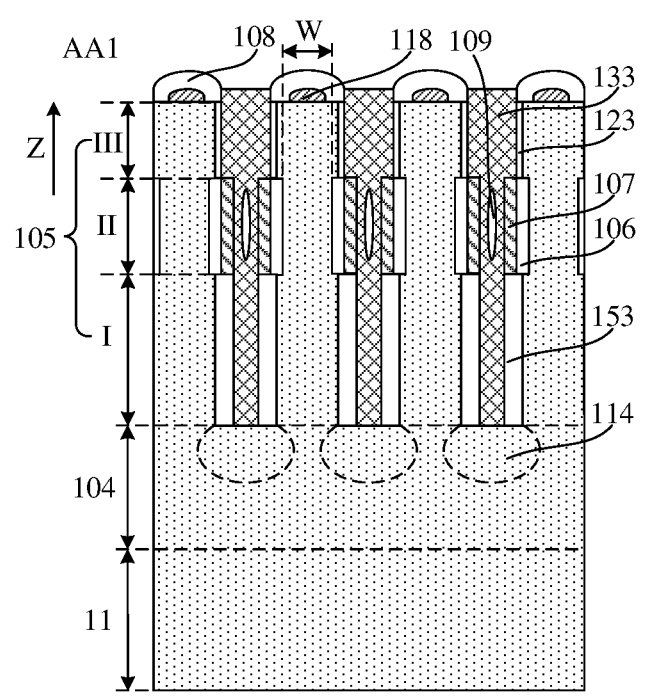

An embodiment of the disclosure provides a semiconductor structure, which is described below in detail with reference to the accompanying drawings. FIG. 1 to FIG. 6 are schematic structural diagrams corresponding to a semiconductor structure according to an embodiment of the disclosure. FIG. 1 is a schematic structural diagram of a semiconductor structure according to an embodiment of the disclosure. FIG. 2 is a schematic cross-sectional view of a semiconductor channel in the structure shown in FIG. 1. FIG. 3 is a schematic cross-sectional view of the structure shown in FIG. 1 in a first cross-sectional direction AA1. FIG. 4 is another schematic cross-sectional view of the structure shown in FIG. 1 in the first cross-sectional direction AA1. FIG. 5 is a schematic cross-sectional view of the structure shown in FIG. 1 in a second cross-sectional direction BB1. FIG. 6 is another schematic structural diagram of the semiconductor structure according to the embodiment of the disclosure.

Referring to FIG. 1 to FIG. 6, the semiconductor structure includes: a base 11; a bit line 104, located on the base 11; and a semiconductor channel 105, located on a surface of the bit line 104. In a direction from the base 11 to the bit line 104, the semiconductor channel 105 includes a first doped region I, a channel region II, and a second doped region III that are sequentially arranged. The first doped region I contacts a bit line 104, and the first doped region I, the channel region II and the second doped region III are doped with first-type doped ions. The channel region II is further doped with second-type doped ions, so that a concentration of majority carriers in the channel region II is less than concentrations of majority carriers in the first doped region I and the second doped region III. The first-type doped ions are one of N-type ions or P-type ions, and the second-type doped ions are the other of P-type ions or N-type ions.

The semiconductor structure may further include: an insulating layer 106, covering a sidewall surface of the channel region II; a word line 107, covering a sidewall surface of the insulating layer 106 away from the channel region II, where sidewalls of adjacent first doped regions I, sidewalls of adjacent word lines 107, and sidewalls of adjacent second doped regions III define a gap; and an isolation layer 103, located in the gap, where a top surface of the isolation layer 103 away from the base 11 is not lower than a top surface of the second doped region III away from the base 11.

Because the semiconductor structure includes a vertical GAA transistor and the bit line 104 is located between the base 11 and the GAA transistor, a 3D stacked storage device can be formed, which helps to improve the integration density of the semiconductor structure.

The semiconductor structure is described below in further detail with reference to FIG. 1 to FIG. 6.

The type of the material of the base 11 may be an element semiconductor material or a crystalline inorganic compound semiconductor material. The element semiconductor material may be silicon or germanium. The crystalline inorganic compound semiconductor material may be silicon carbide, silicon germanide, gallium arsenide, indium galliumide or the like. In some embodiments, the base 11 may be doped with the second-type doped ions.

In some embodiments, the base 11, the bit lines 104, and the semiconductor channels 105 have a same semiconductor element. Accordingly, the semiconductor channels 105 and the bit lines 104 may be formed by the same film structure which is made of a semiconductor element. In this way, the semiconductor channels 105 and the bit lines 104 are an integrated structure, so that an interface state defect between the semiconductor channels 105 and the bit lines 104 is mitigated, thereby improving the performance of the semiconductor structure.

The semiconductor element may include at least one of silicon, carbon, germanium, arsenic, gallium, or indium. In an example, the bit lines 104 and the semiconductor channels 105 both include silicon. In other examples, the bit lines and the semiconductor channels may both include germanium, or the bit lines and the semiconductor channels both include silicon and germanium, or the bit lines and the semiconductor channels both include silicon and carbon, or the bit lines and the semiconductor channels both include arsenic and gallium, or the bit lines and the semiconductor channels both include gallium and indium.

In some embodiments, the material of the bit lines 104 may further include a metal semiconductor compound 114, which has relatively low resistivity compared with a non-metallic semiconductor material. Therefore, compared with the semiconductor channels 105, the bit lines 104 have lower resistivity, which helps to reduce a resistance of the bit lines 104 and reduce a contact resistance between the bit lines 104 and the first doped regions I, thereby further improving the electrical performance of a semiconductor structure. In addition, the resistivity of the bit lines 104 is also less than that of the base 11.

In some embodiments, the material in a region of the bit line 104 located right under the first doped region I is semiconductor material, and the material in a region of the bit line 104 not covered by the first doped region I is metal semiconductor compound. It may be understood that with continuously decreasing device sizes or the adjustment of manufacturing process parameters, the material in the partial region of the bit line 104 located right under the first doped region I is semiconductor material, and the material in the remaining region of the bit line 104 located right under the first doped region I may be metal semiconductor compound. The "remaining region" herein are located on a periphery of the "partial region".

In some embodiments, referring to FIG. 3, a plurality of metal semiconductor compounds 114 in the same bit line 104 are disposed at intervals from each other. In some other embodiments, referring to FIG. 4, the plurality of metal semiconductor compounds 114 in the same bit line 104 are in communication with each other. It needs to be noted that, FIG. 4 only exemplarily shows a case in which adjacent metal semiconductor compounds 114 just contact each other at edges to be in communication. In actual case, a region in which adjacent metal semiconductor compounds 114 contact each other may be larger. A size of the region in which adjacent metal semiconductor compounds 114 contact each other is not limited in the embodiments of the disclosure.

In other embodiments, the material of the entire bit line may be metal semiconductor compound.

In an example where the semiconductor element is silicon, the metal semiconductor compound 114 includes at least one of cobalt silicide, nickel silicide, molybdenum silicide, titanium silicide, tungsten silicide, tantalum silicide, or platinum silicide.

A plurality of bit lines 104 arranged at intervals may be formed on the base 11. Each bit line 104 may contact at least one first doped region I. In FIG. 1 to FIG. 5, for example, four bit lines 104 are arranged at intervals from each other, in which each bit line 104 contacts four first doped regions I. The quantities of bit lines 104 and first doped regions I contacting each bit line 104 may be appropriately set according to an actual electrical requirement.

In some embodiments, when the bit line 104 is doped with the first-type doped ions and the base 11 is doped with the second-type doped ions, the bit lines 104 form PN junctions with the base 11, which help to prevent the bit lines 104 from electricity leakage, thereby further improving the electrical performance of a semiconductor structure. It needs to be noted that, in other embodiments, the base may be not doped with the second-type doped ions.

In some embodiments, the first-type doped ions are N-type ions, and the second-type doped ions are P-type ions. Specifically, the N-type ions include at least one of arsenic ions, phosphorus ions, or antimony ions, and the P-type ions includes at least one of boron ions, indium ions, or gallium ions. In some other embodiments, the first-type doped ions may be P-type ions, and the second-type doped ions may be N-type ions.

In some embodiments, the first-type doped ions may all be phosphorus ions, and the second-type doped ions may all be boron ions. In other embodiments, the first-type doped ions in the first doped regions may be different from the first-type doped ions in the second doped regions.

In some embodiments, the first doped region I, the channel region II, and the second doped region III in a semiconductor channel 105 are all doped with first-type doped ions. In addition, referring to FIG. 2, it exemplarily shows that a diffusion region IV defined by dash lines and a periphery of a channel region in the semiconductor channel 105 have second-type doped ions. That is, the second-type doped ions are not only present in the channel region II, but also in a region of the first doped region I close to the channel region II and a region of the second doped region III close to the channel region II, and a doping concentration of the first-type doped ions in the diffusion region IV is greater than a doping concentration of the second-type doped ions in the diffusion region IV. This helps to reduce an effective doping concentration of the first-type doped ions in the diffusion region IV. Moreover, in this embodiment, an effective doping concentration of the first-type doped ions in the channel region II is less than that in a partial region of the first doped region I contacting the channel region II, and the effective doping concentration of the first-type doped ions in the channel region II is also less than that in a partial region of the second doped region III contacting the channel region II.

It needs to be noted that, the effective doping concentration of the first-type doped ions in the partial region of the first doped region I contacting the channel region II is specifically a difference between a doping concentration of the first-type doped ions and a doping concentration of the second-type doped ions in the partial region. The effective doping concentration of the first-type doped ions in the partial region of the second doped region III contacting the channel region II is specifically a difference between a doping concentration of the first-type doped ions and a doping concentration of the second-type doped ions in the partial region.

In the semiconductor channel 105, for a specified region, when the region is doped with both the first-type doped ions and the second-type doped ions, an impurity compensation phenomenon occurs as a result of the joint effect of the first-type doped ions and the second-type doped ions, so that majority carriers in the region are reduced. When a doping concentration of the first-type doped ions in the region is greater than a doping concentration of the second-type doped ions in the region, an effective doping concentration of the first-type doped ions in the region decreases, that is, a concentration of majority carriers in the region decreases.

Therefore, when the effective doping concentration of the first-type doped ions in the partial region of the first doped region I contacting the channel region II decreases, the concentration of majority carriers in the region decreases, so that the electric field strength at a junction between the first doped region I and the channel region II decreases, making the semiconductor structure less susceptible to collisional ionization and reducing Gate-Induced Drain Leakage (GIDL). Therefore, the decrease in the effective doping concentration of the first-type doped ions in the partial region of the second doped region III contacting the channel region II further makes the semiconductor structure less susceptible to collisional ionization and reduces the GIDL.

In some embodiments, a doping concentration of the first-type doped ions in the channel region II may be greater than a doping concentration of the second-type doped ions in the channel region II. The effective doping concentration of the first-type doped ions in the channel region II is less than that in the first doped region I. The effective doping concentration of the first-type doped ions in the channel region II is less than that in the second doped region III.

It needs to be noted that, the effective doping concentration of the first-type doped ions in the channel region II is specifically a difference between the doping concentration of the first-type doped ions and the doping concentration of the second-type doped ions in the channel region II. The effective doping concentration of the first-type doped ions in the first doped region I is specifically a difference between a doping concentration of the first-type doped ions and a doping concentration of the second-type doped ions in the first doped region I. The effective doping concentration of the first-type doped ions in the second doped region III is specifically a difference between a doping concentration of the first-type doped ions and a doping concentration of the second-type doped ions in the second doped region III.

The effective doping concentration of the first-type doped ions in the channel region II is less than that in the first doped region I and is also less than that in the second doped region III, so that the concentration of majority carriers in the channel region II is less than the concentrations of majority carriers in the first doped region I and the second doped region III. This helps to ensure that the concentration of majority carriers in the channel region II is relatively low, while ensuring that the concentrations of majority carriers in the first doped region I and the second doped region III are relatively high, so that while the on/off ratio of the channel region II is increased, a threshold voltage of a transistor formed by the first doped region I, the channel region II, and the second doped region III is reduced and the saturation current of the transistor is increased, thereby improving the electrical performance of a semiconductor structure.

In some embodiments, the effective doping concentration of the first-type doped ions in the channel region II may be $8\times10^{18}$ atom/cm$^3$ to $2\times10^{19}$ atom/cm$^3$. Within the concentration range, the on/off ratio of the channel region II is relatively high, to ensure that the channel region II can be quickly turned on or off.

For example, the effective doping concentration of the first-type doped ions in the channel region II may be $1\times10^{19}$ atom/cm$^3$, so that while it is ensured that the channel region II has a relatively high on/off ratio, it is ensured that the channel region II has relatively high conductivity.

In addition, the effective doping concentration of the first-type doped ions in the first doped region I may be $3\times10^{19}$ atom/cm$^3$ to $1\times10^{20}$ atom/cm$^3$. The effective doping concentration of the first-type doped ions in the second doped region III may be $3\times10^{19}$ atom/cm$^3$ to $1\times10^{20}$ atom/cm$^3$. Within the concentration range, the concentrations of majority carriers in the first doped region I and the second doped region III are both relatively high, and thus resistances of the first doped region I and the second doped region III are both relatively low, helping to ensure that the transistor formed by the first doped region I, the channel region II, and the second doped region III has a relatively low threshold voltage and a relatively high saturation current.

For example, the effective doping concentration of the first-type doped ions in the first doped region I may be $1\times10^{20}$ atom/cm$^3$, and an effective doping concentration of the second-type doped ions in the second doped region III may also be $1\times10^{20}$ atom/cm$^3$, helping to ensuring that both the first doped region I and the second doped region III have high conductivity.

In some embodiments, in a direction Z from the base 11 to the bit lines 104, a height of the semiconductor channels 105 is 100 nm to 150 nm, and heights of the first doped region I, the channel region II, and the second doped region III are all 30 nm to 50 nm.

In some embodiments, the area of the orthographic projection of the channel region II onto the base 11 may be smaller than the area of the orthographic projection of the second doped region III onto the base 11 and the area of the orthographic projection of the first doped region I onto the base 11. This helps to form a channel region II with a smaller cross-sectional area in a cross-section perpendicular to the direction Z, which helps to improve the controllability of the word line 107 surrounding a sidewall of the channel region II on the channel region II, so that it is easier to control the on or off of the GAA transistor. In other embodiments, the orthographic projections of the first doped region, the channel region, and the second doped region onto the base may be equal. Alternatively, the areas of the orthographic projections of the channel region and the second doped region onto the base are both less than the area of the orthographic projection of the first doped region onto the base.

Referring to FIG. 3 and FIG. 5 together, in the cross-section perpendicular to the direction Z, each of a width W and a length L of the channel region II may not be greater than 10 nm, which helps to ensure a good controllability of the word line 107 on the channel region II.

In addition, an isolation layer 103 may include a second dielectric layer 123, a third dielectric layer 133, a fourth dielectric layer 143, and a fifth dielectric layer 153.

The fourth dielectric layer 143 is located in an interval between two adjacent ones of the bit lines 104, and is located in an interval between adjacent first doped regions I on two adjacent ones of the bit lines 104. The fifth dielectric layer 153 is located on sidewalls of adjacent first doped regions I on a same bit line 104, and is located on a sidewall of the fourth dielectric layer 143, and a first gap is provided between two adjacent ones of the fifth dielectric layers 153. The fourth dielectric layer 143 and the fifth dielectric layer 153 jointly achieve electrical insulation between adjacent first doped regions I and between adjacent bit lines 104.

In some embodiments, the material of the fourth dielectric layer 143 is the same as the material of the fifth dielectric layer 153. For example, the material of the fourth dielectric layer 143 and the material of the fifth dielectric layer 153 may both be silicon oxide. In other embodiments, the material of the fourth dielectric layer may also be different from the material of the fifth dielectric layer, provided that the material of the fourth dielectric layer and the material of the fifth dielectric layer are both materials with a good insulation effect.

A second gap is provided between two adjacent ones of the word lines 107. The second dielectric layer 123 covers a sidewall surface of the second doped region III, and a third gap is provided between two second dielectric layers 123 respectively located on sidewalls of two adjacent ones of the second doped regions III. The third dielectric layer 133 is located in the first gap, the second gap, and the third gap.

The first gap, the second gap, and the third gap are in communication with each other. In some embodiments, referring to FIG. 3 to FIG. 5, the third dielectric layer 133 fills up the first gap, the second gap, and the third gap, and the top surface of the third dielectric layer 133 away from the base 11 is higher than the top surface of the second doped region III away from the base 11. In still some other embodiments, referring to FIG. 6, a fourth gap 109 is provided in the third dielectric layer 133 located in the second gap. That is, in addition to the third dielectric layer 133, the fourth gap 109 is further provided between two adjacent ones of the word lines 107, which helps to reduce a capacitance generated between adjacent word lines 107, thereby improving the electrical properties of the semiconductor structure. In another example, the fourth gap may exist in the third dielectric layer located in the second gap and may also exist in the third dielectric layer located in the first gap, or exist in the third dielectric layer located in the third gap.

In some embodiments, the fourth dielectric layer 143 and the fifth dielectric layer 153 jointly form a first isolation layer 113. An outline of the orthographic projection of a periphery of the insulating layer 106 onto the base 11 falls within an orthographic projection of a periphery of the first isolation layer 113 onto the base 11. That is, referring to FIG. 3 to FIG. 5, compared with an outer wall of the first isolation layer 113 away from the semiconductor channel 105, an outer wall of the insulating layer 106 away from the semiconductor channel 105 is closer to the semiconductor channel 105. The material of the insulating layer 106 is silicon oxide. In other embodiments, the insulating layer and the second dielectric layer may be the same film structure. That is, the insulating layer and the third dielectric layer may be formed by using the same process step. The material of the insulating layer and the material of the third dielectric layer include at least one of silicon oxide or silicon nitride.

The semiconductor structure may further include metal contact layers 108 located on the top surfaces of the second doped regions III away from the base 11. The metal semiconductor compounds 114 and the metal contact layers 108 have a same metal element. The metal element includes at least one of cobalt, nickel, molybdenum, titanium, tungsten, tantalum, or platinum.

The metal contact layers 108 have a metal element. Therefore, when a bottom electrode of a capacitor structure is formed on a metal contact layer 108 subsequently, the metal contact layer 108 forms an ohmic contact with the bottom electrode, to prevent a Schottky barrier contact from being formed due to direct contact of the lower electrode with a semiconductor material. The ohmic contact helps to reduce a contact resistance between the second doped region III and the bottom electrode, so that the energy consumption of a semiconductor structure during working is reduced and an RC delay effect is mitigated, thereby improving the electrical performance of a semiconductor structure. In addition, from the perspective of a manufacturing process, the metal contact layer 108 and the metal semiconductor compound 114 have the same metal element, to facilitate the formation of the metal contact layer 108 and the formation of the metal semiconductor compound 114 in the bit line 104 in one process step.

An orthographic projection of the metal contact layer 108 onto the base 11 may cover an orthographic projection of the second doped region III onto the base 11, which helps to increase a contact area between the metal contact layer 108 and the bottom electrode, so that a contact resistance between the metal contact layer 108 and the bottom electrode is reduced, thereby improving the electrical performance of a semiconductor structure.

The semiconductor structure may further include a transition layer 118, located between the second doped region III and the metal contact layer 108. The transition layer 118 is located on a partial top surface of the second doped region III. The metal contact layer 108 covers the remaining surface of the transition layer 118. The transition layer 118 and the second doped region III are doped with doped ions of the same type, and a doping concentration of the doped ions in the transition layer 118 is greater than that in the second doped region III, so that a resistance of the transition layer 118 is less than that of the second doped region III, which helps to further reduce a transmission resistance between the second doped region III and the bottom electrode.

In other embodiments, the semiconductor structure may include no transition layer, and only the metal contact layer is provided on a top surface of the second doped region.

The semiconductor structure may further include a capacitor structure (not shown in the figure) located on a surface formed jointly by the metal contact layer 108 and the third dielectric layer 133.

In summary, vertical GAA transistors are provided on the base 11. In a GAA transistor, the concentration of majority carriers in the channel region II is less than the concentrations of majority carriers in the first doped region I the second doped region III. This helps to ensured that the concentration of majority carriers in the channel region II is relatively low, while ensuring that the concentrations of majority carriers in the first doped region I and the second doped region III are relatively high, so that while the on/off ratio of the channel region II is increased, the threshold voltage of the transistor formed by the first doped region I, the channel region II, and the second doped region III is reduced, and the saturation current of the transistor is increased, thereby improving the electrical performance of a semiconductor structure.

Another embodiment of the disclosure further provides a method for manufacturing a semiconductor structure, which may be used to form the foregoing semiconductor structure.

FIG. 7 to FIG. 36 are schematic structural sectional views corresponding to the steps in the method for manufacturing a semiconductor structure according to another embodiment of the disclosure. The method for manufacturing a semiconductor structure provided in this embodiment is described below in detail with reference to the accompanying drawings. Parts that are the same as or correspond to the foregoing embodiments are not described below in detail again.

Referring to FIG. 7 to FIG. 10, a base 11 is provided, initial bit lines 124 are formed on the base 11 and semiconductor channels 105 are formed respectively on surfaces of the initial bit lines 124 away from the base 11. In a direction from the base 11 to the initial bit lines 124, each semiconductor channel 105 includes a first doped region I, a channel region II, and a second doped region III that are sequentially arranged. The first doped region I, the channel region II, and the second doped region III are doped with first-type doped ions at a same doping concentration. The first-type doped ions are one of N-type ions or P-type ions.

The providing a base 11 and forming initial bit lines 124 and semiconductor channels 105 on the base 11 includes the following steps.

Figure 7:
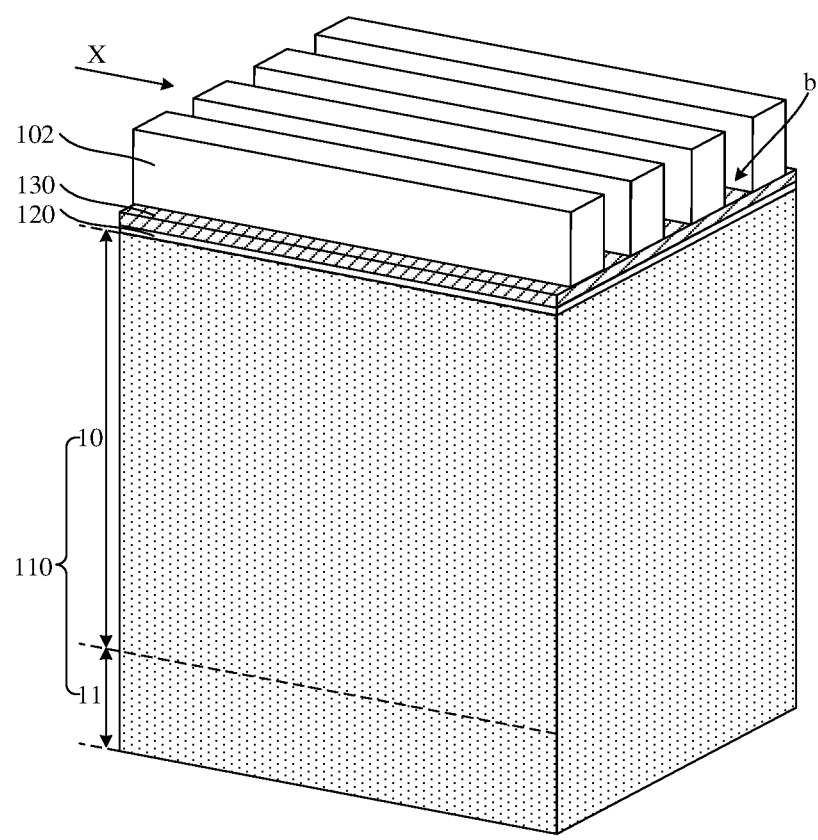

Referring to FIG. 7, a substrate 110 is provided. The type of material of the substrate 110 may be an element semiconductor material or a crystalline inorganic compound semiconductor material. The element semiconductor material may be silicon or germanium. The crystalline inorganic compound semiconductor material may be silicon carbide, silicon germanide, gallium arsenide, indium galliumide or the like.

The substrate 110 includes: a base 11, which is doped with second-type doped ions that are one N-type ions or P-type ions; and an initial semiconductor layer 10, disposed on the base 11.

The initial semiconductor layer 10 is doped and annealed, so that the initial semiconductor layer 10 is doped with the first-type doped ions for subsequent etching of the initial semiconductor layer 10 to form initial bit lines 124 and semiconductor channels 105.

The doping process may be performed by a high temperature diffusion method or an ion implantation method. After the initial semiconductor layer 10 is doped in an ion implantation manner, an annealing temperature of the annealing is 800° C. to 1000° C.

In some embodiments, a doping concentration of the first-type doped ions in the initial semiconductor layer 10 is $3 \times 10^{19}$ atom/cm$^3$ to $1 \times 10^{20}$ atom/cm$^3$, and in a direction from the initial semiconductor layer 10 to the base 11, a doping depth of the first-type doped ions in the initial semiconductor layer 10 is 150 nm to 250 nm.

In some embodiments, the first-type doped ions are N-type ions, and the second-type doped ions are P-type ions. In other embodiments, the first-type doped ions may be P-type ions, and the second-type doped ions may be N-type ions.

A buffer layer 120 and a barrier layer 130 that are sequentially stacked are formed on a side of the initial semiconductor layer 10 away from the base 11. In some embodiments, the buffer layer 120 and the barrier layer 130 may be formed by using a deposition process. The material of the buffer layer 120 is silicon oxide, and the material of the barrier layer 130 is silicon nitride.

Silicon nitride may be deposited by using a chemical vapor deposition process to form the barrier layer 130. An oxidation speed of the silicon nitride film is very slow, which helps to protect the substrate 110 located under the silicon nitride film, to prevent the substrate 110 from being oxidized.

In some embodiments, the substrate 110 is a silicon substrate. There are large mismatches both between a lattice constant and a thermal expansion coefficient of silicon nitride and between a lattice constant and a thermal expansion coefficient of the silicon substrate. Therefore, if silicon nitride is directly formed on the silicon substrate, there is a large defect density at an interface between silicon nitride and silicon. The interface tends to become a carrier trap and a recombination center to affect the carrier mobility of silicon. As a result, the performance and the service life of the semiconductor structure are affected. In addition, there is relatively high stress in the silicon nitride film, and thus a fissure phenomenon is likely to occur when it is directly deposited on the silicon substrate. Therefore, silicon oxide is formed as the buffer layer 120 on the silicon substrate before silicon nitride is deposited, which helps to improve the performance and the service life of the semiconductor structure.

Referring to FIG. 7 again, first mask layers 102 are formed on the barrier layer 130. The first mask layers 102 have a plurality of first openings b that are discrete from each other. In an extending direction X of each first opening b, a length of the first openings b is consistent with the length of a subsequently formed bit line.

Figure 8:
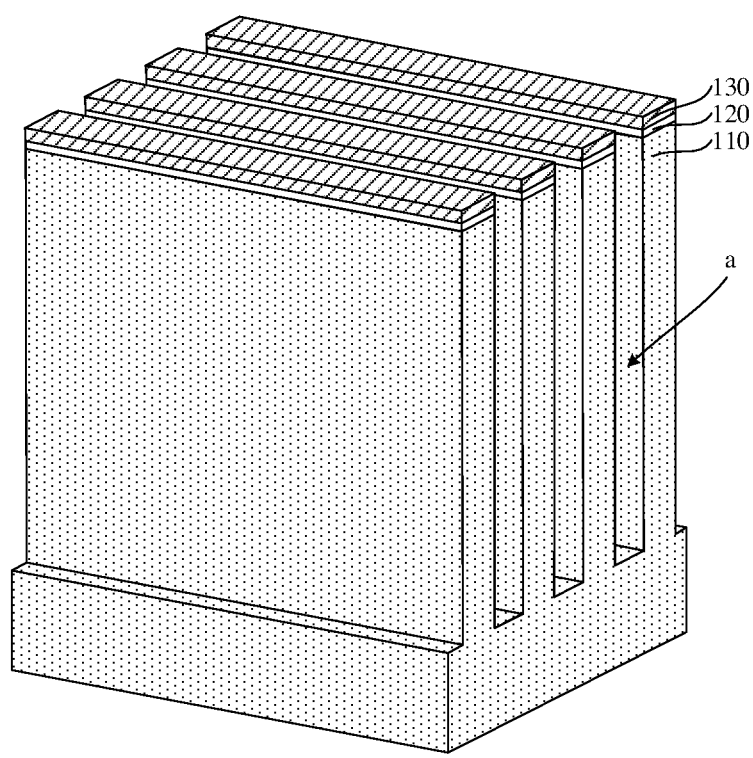

Referring to FIG. 8, the barrier layer 130, the buffer layer 120 and the initial semiconductor layer 10 are etched with the first mask layers 102 as a mask, to form a plurality of first trenches a, and the first mask layers 102 are removed.

In some embodiments, in a direction Z perpendicular to a surface of the base 11, a depth of the first trenches a is 250 nm to 300 nm. The depth of the first trenches a is greater than the doping depth of the first-type doped ions in the initial semiconductor layer 10, which helps to ensure that the initial semiconductor layer 10 doped with the first-type doped ions is etched, to facilitate subsequent formation of the semiconductor channels and the bit lines with high doping concentrations of the first-type doped ions.

Figure 9:
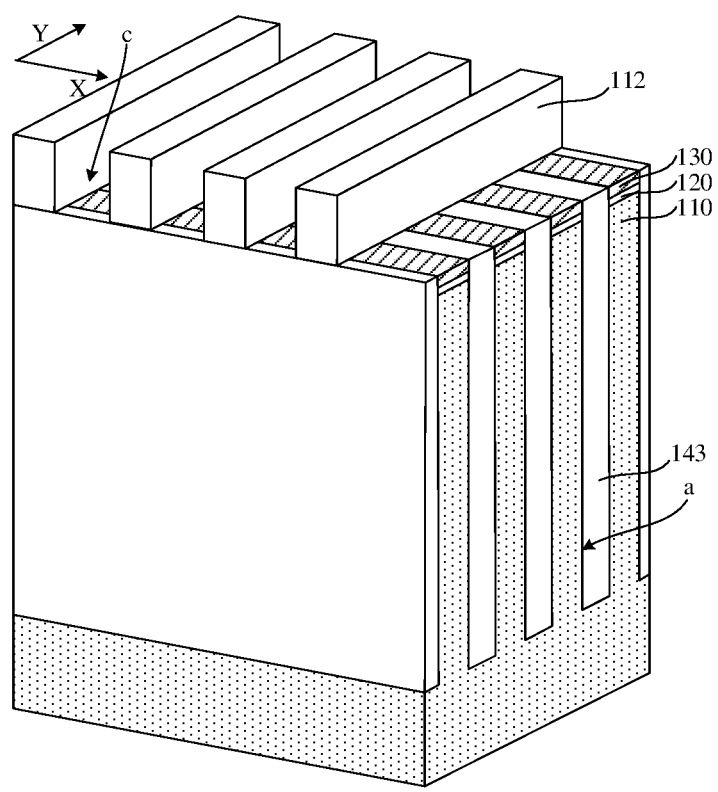

Referring to FIG. 9, fourth dielectric layers 143 are formed in the first trenches a.

In some embodiments, the fourth dielectric layers 143 may be formed by using the following process steps: performing a deposition process, to form a fourth dielectric film that covers a top surface of the barrier layer 130 and fills up the first trenches a; and performing a chemical-mechanical planarization process on the fourth dielectric film to expose the top surface of the barrier layer 130, in which the remaining fourth dielectric film serves as the fourth dielectric layers 143. The material of the fourth dielectric films includes silicon oxide.

In addition, second mask layers 112 are formed on a top surface formed jointly by the fourth dielectric layers 143 and the remaining barrier layer 130 together. The second mask layers 112 have a plurality of second openings c that are discrete from each other. In an extending direction Y of the second openings c, a length of them is consistent with a length of subsequently formed word lines.

In some embodiments, referring to FIG. 7 and FIG. 9 together, the extending direction X of the first openings b is perpendicular to the extending direction Y of the second openings c, so that the eventually formed semiconductor channels 105 presents an arrangement manner of 4F2, which helps to further improve the integration density of the semiconductor structure. In other embodiments, an extending direction of the first openings intersects an extending direction of the second openings, and an angle between the two extending directions may be not 90°.

In some embodiments, a ratio of an opening width of the first openings b in the direction Y to an opening width of the second openings c in the direction X may be 2 to 1, to ensure that a through via that exposes an initial first dielectric layer surrounding sidewalls of a channel region II can be formed subsequently, which facilitates subsequent self-alignment formation of word lines. For example, the opening width of the first openings b in the direction Y may be equal to the opening width of the second openings c in the direction X, and thus a spacing between two adjacent ones of the first openings b is equal to a spacing between two adjacent ones of the second openings c. As a result, in one aspect, a plurality of semiconductor channels subsequently formed are neatly arranged, thereby further improving the integration density of the semiconductor structure. In another aspect, the first mask layer 102 and the second mask layer 112 may be formed with the same mask, which helps to reduce the manufacturing costs of the semiconductor structure.

In some embodiments, both a method for forming the first mask layer 102 and a method for forming the second mask layer 112 include a Self-Aligned Quadruple Patterning (SAQP) or Self-Aligned Double Patterning (SADP).

Figure 10:
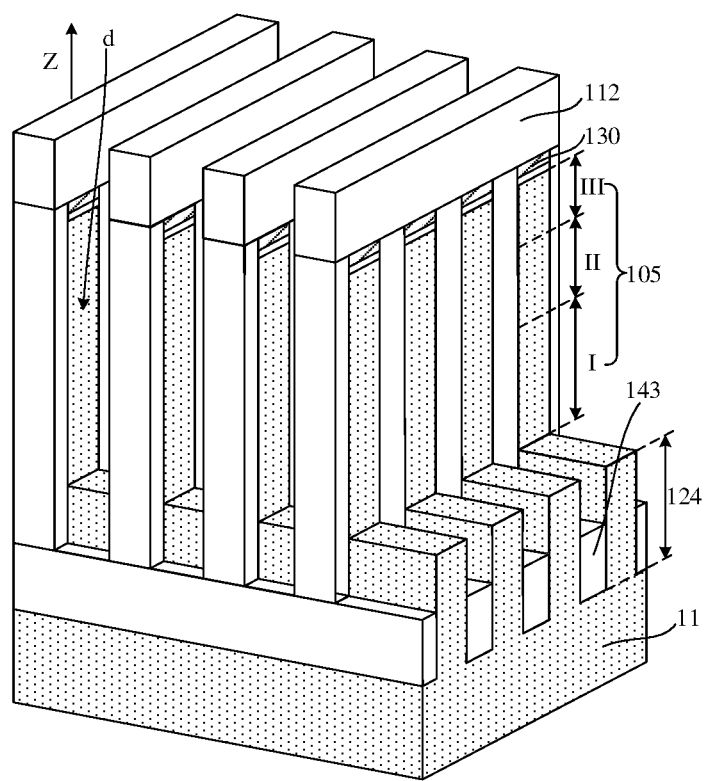

Referring to FIG. 10, the initial semiconductor layer 10 (referring to FIG. 7) and the fourth dielectric layer 143 are etched with the second mask layer 112 as a mask, to form a plurality of second trenches d, initial bit lines 124, and semiconductor channels 105. In the direction Z perpendicular to the surface of the base 11, the depth of the second trenches d is less than the depth of the first trenches a, which helps to form the initial bit lines 124, while forming the plurality of semiconductor channels 105 that are discrete from each other on the side of each of the initial bit lines 124 away from the base 11, and thus to bring the initial bit lines 124 into contact with the first doped regions I of the semiconductor channels 105. The second mask layer 112 is removed.

In some embodiments, the depth of the second trenches d is 100 nm to 150 nm. The doping depth of the first-type doped ions in the initial semiconductor layer 10 is 150 nm to 250 nm, which helps to change the initial semiconductor layer 10 that is mostly or completely doped with the first-type doped ions undergoes into the semiconductor channels 105 after two etchings.

In addition, the material of the substrate 110 is silicon, and the material of the fourth dielectric layer 143 is silicon oxide. In the step of etching the initial semiconductor layer 10 and the fourth dielectric layers 143 with the second mask layer 112 as a mask, an etching rate of silicon oxide is greater than an etching rate of silicon in an etching process, and therefore partial sidewalls of the initial bit lines 124 is exposed.

To achieve electrical insulation between adjacent initial bit lines 124 and between adjacent semiconductor channels 105, after the initial semiconductor layer 10 and the fourth dielectric layers 143 are etched with the second mask layer 112 as a mask, there are still the remaining fourth dielectric layers 143 each located in an interval between two adjacent ones of the initial bit lines 124 and in an interval between two adjacent ones of the semiconductor channels 105.

In some embodiments, a GAA transistor in which the semiconductor channels 105 are perpendicular to top surfaces of the initial bit lines 124 away from the base 11 is formed, to form a 3D stacked semiconductor structure, so that under the premise of causing no adverse impact to the electrical performance of the GAA transistor, the GAA transistor with smaller size features is designed, thereby improving the integration density of the semiconductor structure.

In addition, the initial bit lines 124 and the semiconductor channels 105 are formed simultaneously with the first mask layer 102 and the second mask layer 112 as a mask through two etching processes. As a result, in one aspect, a size of the semiconductor channels 105 can be regulated by regulating sizes of the first openings b and the second openings c, to form the semiconductor channels 105 with relatively high size accuracy. In another aspect, the initial bit lines 124 and the semiconductor channels 105 are both formed by etching the initial semiconductor layer 10. That is, the initial bit lines 124 and the semiconductor channels 105 are formed with the same film structure, so that the initial bit lines 124 and the semiconductor channels 105 are an integrated structure, thereby mitigating an interface state defect between the initial bit lines 124 and the semiconductor channels 105 and thus mitigating the performance of the semiconductor structure.

Referring to FIG. 11 to FIG. 34, first isolation layers 113 each covering a sidewall surface of each first doped region I are formed. A first interval is provided between the first isolation layers 113 respectively on sidewalls of two adjacent ones of the first doped regions I on a same initial bit line 124. The first interval exposes the initial bit line 124. The second isolation layers 163 are formed. Each second isolation layer 163 is located in each first interval. Top surfaces of the second isolation layers 163 away from the base 11 are not lower than top surfaces of the second doped regions III away from the base 11. A second interval is provided between each second isolation layer 163 and a channel region II adjacent thereto. Third isolation layers 173 each covering sidewall surfaces of the second doped regions III are formed. The third isolation layers 173 contact the second isolation layers 163. A third interval is provided between second isolation layers 163 respectively located on sidewalls of two adjacent ones of the second doped regions III on two adjacent ones of the initial bit lines 124. The second interval is in communication with the third interval.

Figure 11:
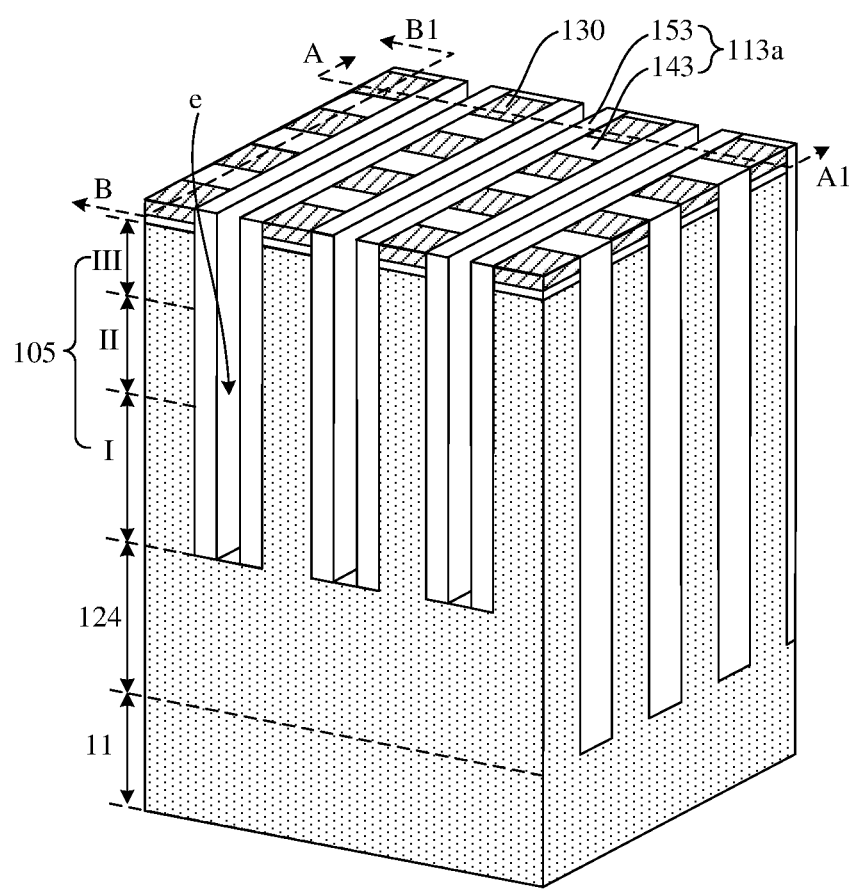
Figure 12:
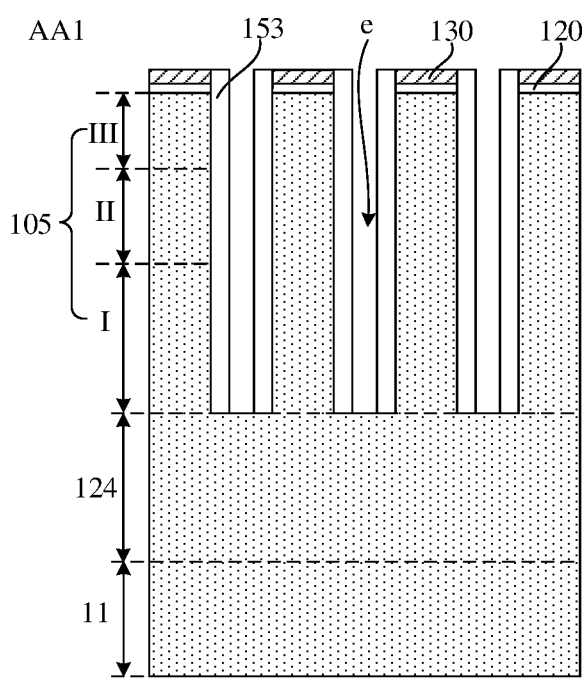
Figure 13:
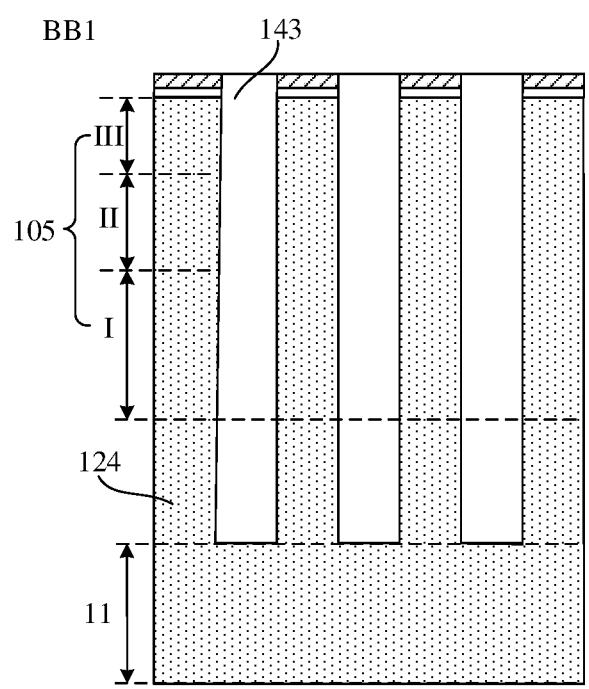

FIG. 12 is a schematic sectional view of the structure shown in FIG. 11 in a first sectional direction AA1. FIG. 13 is a schematic sectional view of the structure shown in FIG. 11 in a second sectional direction BB1. It needs to be noted that, subsequently, according to the requirement of description, one or two of schematic sectional views in the first sectional direction AA1 and the second cross-sectional direction BB1 are set. When reference is made to one figure, the figure is the schematic sectional view in the first sectional direction AA1. When reference is made to both figures, the figures are sequentially the schematic-sectional view in the first sectional direction AA1 and the schematic sectional view in the second sectional direction BB1.

In some embodiments, referring to FIG. 1 and FIG. 11 to FIG. 33 together, the formation of the first isolation layers 113, the second isolation layers 163, the third isolation layers 173, insulating layers 106, word lines 107, and isolation layers 103 includes the following steps.

Referring to FIG. 11, initial first isolation layers 113a are formed. The initial first isolation layers 113a surround sidewalls of each of the semiconductor channels 105, and a fourth interval e is provided between initial first isolation layers 113a respectively located on the sidewalls of two adjacent ones of the semiconductor channels 105 on a same initial bit line 124.

The step of forming the initial first isolation layers 113a may be: forming a first isolation film that conformally covers sidewalls and bottoms of the second trenches d (referring to FIG. 10), and is further located on the top surfaces of the barrier layer 130 and the fourth dielectric layers 143; performing a maskless dry etching process on the first isolation film, until the barrier layer 130 is exposed. Within the same etching time, the etching process etches different regions of the first isolation film by the same thickness, so that fifth dielectric layers 153 are formed.

Referring to FIG. 11 to FIG. 13 together, the fifth dielectric layer 153 is located on a sidewall of the second trench d (referring to FIG. 10). The fourth dielectric layer 143 is located in an interval between two adjacent ones of the semiconductor channels 105. The fourth dielectric layer 143 and the fifth dielectric layer 153 jointly form the initial first isolation layer 113a, and the fourth interval e is provided between two fifth dielectric layers 153 located on the sidewalls of a second trench d.

The material of the fourth dielectric layer 143 is the same as that of the fifth dielectric layer 153, to facilitate subsequent removal of both the fourth dielectric layer 143 and the fifth dielectric layer 153 that correspond to the sidewalls of the channel region II by an etching process, so that a gap is formed between the sidewalls of the channel region II and the subsequently formed second isolation layer, to facilitate subsequent formation of a space for manufacturing a word line. Further, the material of the fourth dielectric layers 143 and the material of the fifth dielectric layers 153 are both silicon oxide.

In other embodiments, the material of the fourth dielectric layer may also be different from that of the fifth dielectric layer, provided that the material of the fourth dielectric layer and the material of the fifth dielectric layer are both materials with a good insulation effect. Then, the fourth dielectric layer and the fifth dielectric layer that correspond to the sidewalls of the channel region may be removed in separate steps.

Figure 14:
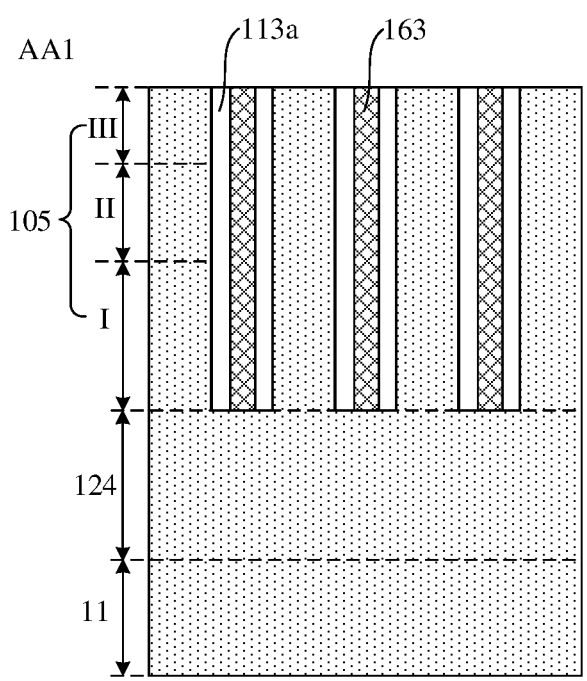

Referring to FIG. 14, the second isolation layers 163 are formed. Each of the second isolation layers 163 fills up each of the fourth intervals e (referring to FIG. 13), and the material of the second isolation layers 163 is different from that of the initial first isolation layers 113a. The material of the second isolation layers 163 includes silicon nitride.

Figure 15:
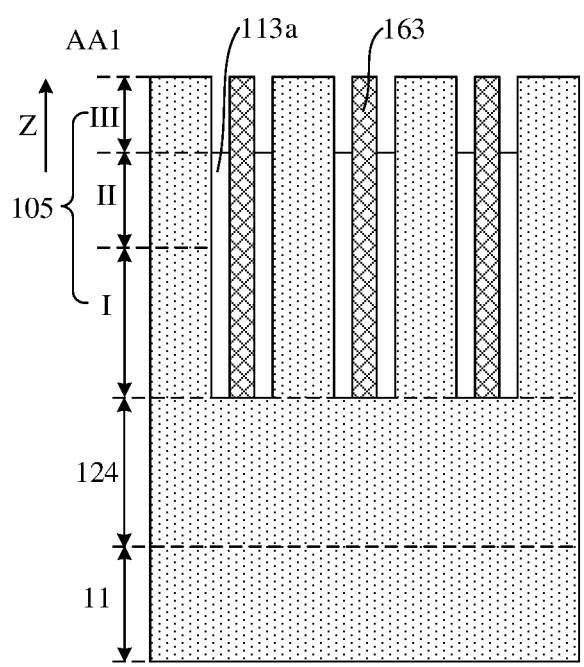

Referring to FIG. 15, the partial initial first isolation layers 113a are etched to expose sidewalls of the second doped regions III.

Figure 16:
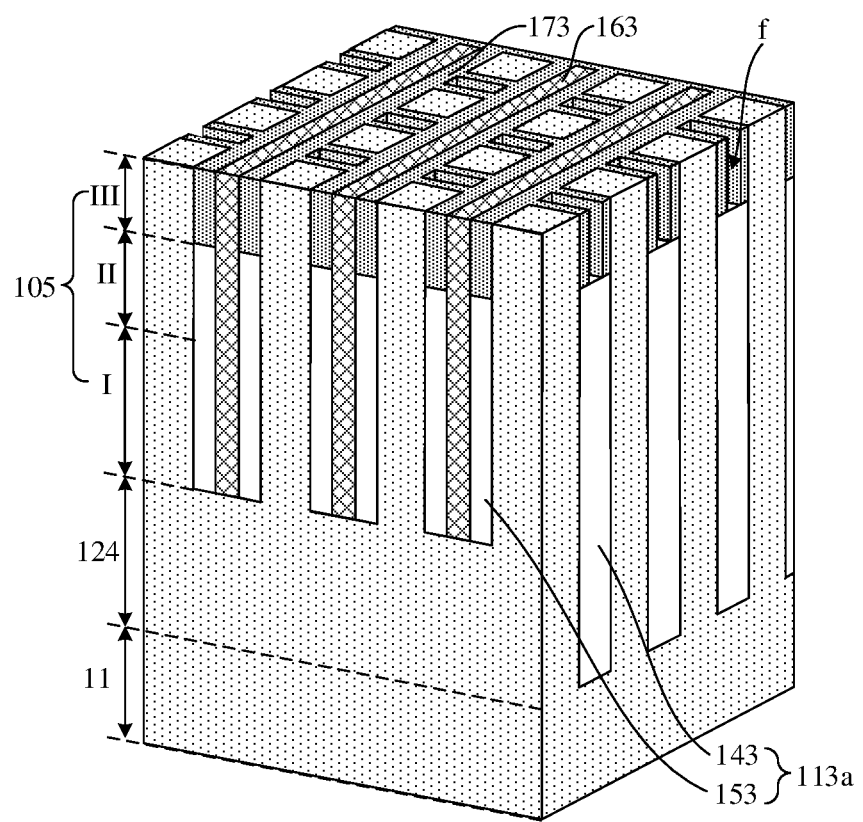
Figure 17:
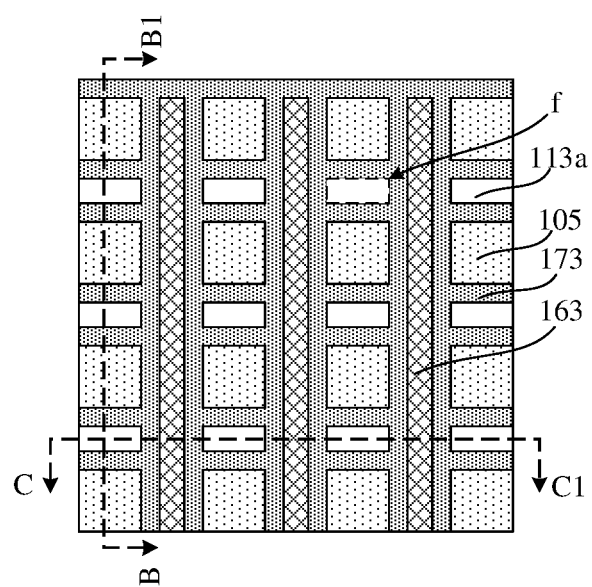
Figure 18:
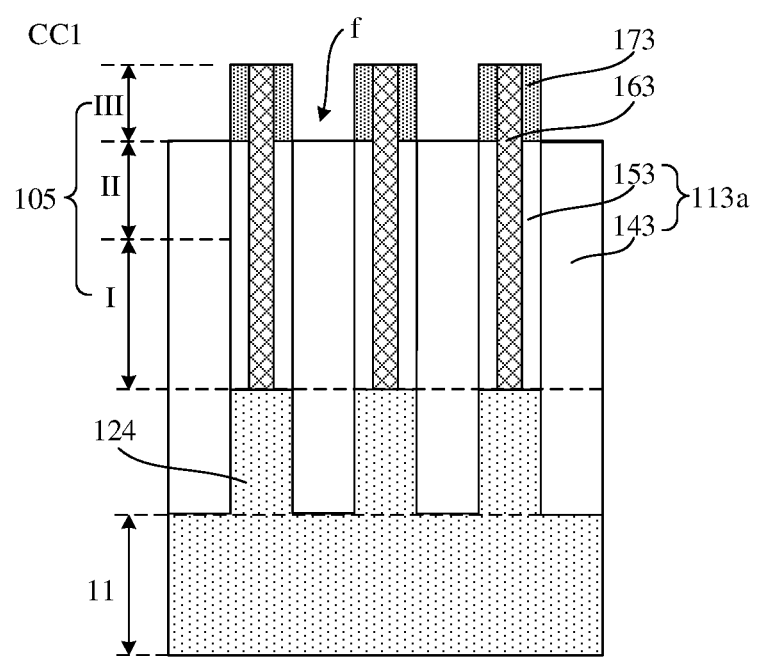
Figure 19:
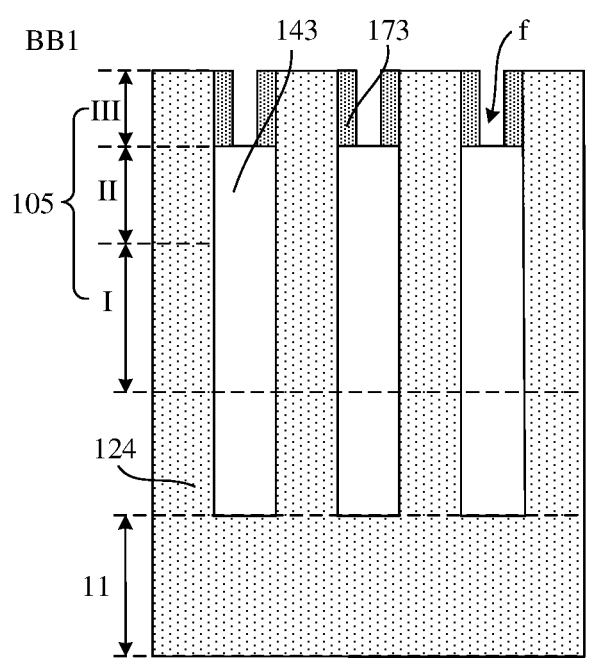

Referring to FIG. 16 to FIG. 19, FIG. 17 is a schematic top view of FIG. 16, FIG. 18 is a schematic sectional view in a third sectional direction CC1, and FIG. 19 is a schematic sectional view in the second sectional direction BB1.

Third isolation layers 173 are formed. The third isolation layers 173 surround the sidewalls of the second doped regions III and are located on sidewalls of the second isolation layers 163. The third isolation layers 173 located on the sidewalls of the second doped regions III and the sidewalls of the second isolation layers 163 jointly define a through via f. A bottom of the through via f exposes the initial first isolation layer 113a, and the material of the third isolation layers 173 are different from that of the initial first isolation layers 113a.

Referring to FIG. 18 and FIG. 19, while surrounding the sidewalls of the second doped regions III, the third isolation layers 173 cover top surfaces of the fifth dielectric layers 153 and partial top surfaces of the fourth dielectric layers 143, and a through via f exposes the partial top surface of each fourth dielectric layer 143.

In some embodiments, the third isolation layers 173 may be formed by the following process steps: performing a deposition process, to form a third isolation film conformally covering a surface formed jointly by the semiconductor channels 105, the initial first isolation layers 113a, and the second isolation layers 163; and performing a maskless dry etching process on the third isolation film, until top surfaces of the second doped regions III are exposed. Within the same etching time, the etching process etches different regions of the third isolation film by the same thickness, so that the third isolation layers 173 exposing the second isolation layers 163 are formed. The material of the third isolation layers 173 includes silicon nitride.

In addition, in the first mask layers 102 and the second mask layers 112 described previously, the ratio of the opening width of the first openings b in the direction Y to the opening width of the second openings c in the direction X is 2 to 1. Therefore, during the formation of the third isolation layers 173, it can be ensured that while filling up intervals between adjacent semiconductor channels 105 on a same initial bit line 124, the third isolation layers 173 does not fill up spaces between adjacent semiconductor channels 105 respectively on two adjacent ones of the initial bit lines 124, so that it is ensured that the through via f exposing the partial top surface of each fourth dielectric layer 143 is formed, to facilitate subsequent removal of the partial initial first isolation layers 113a by means of the through via f.

Figure 20:
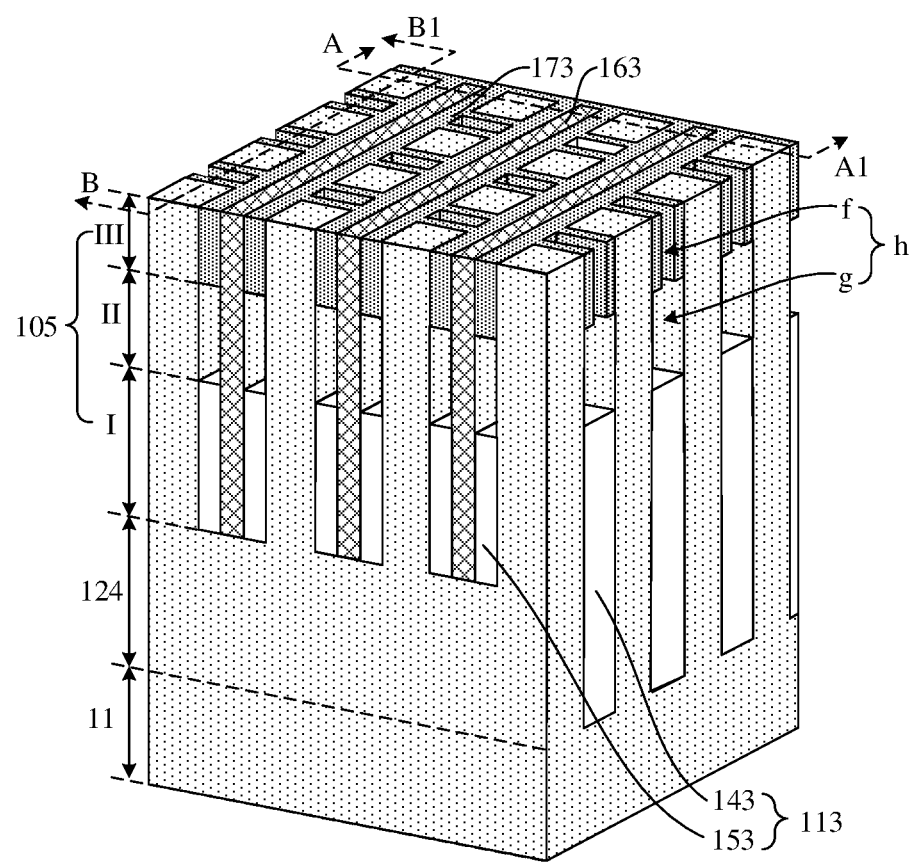
Figure 21:
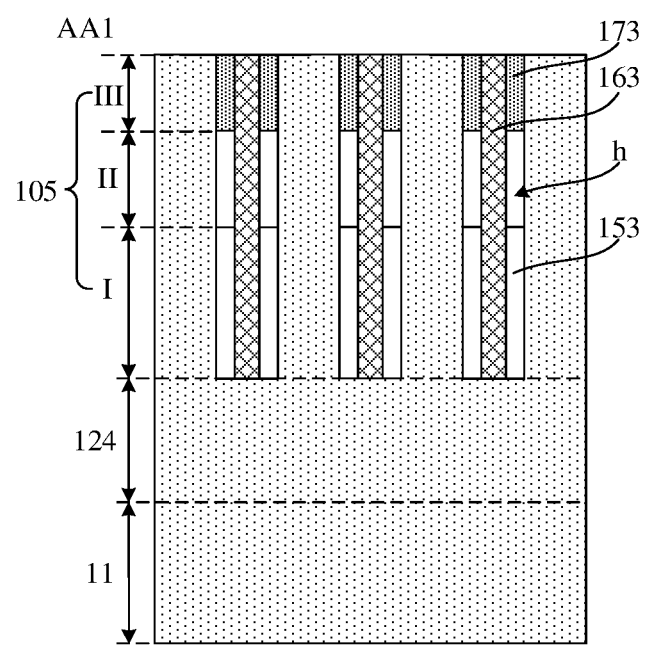
Figure 22:
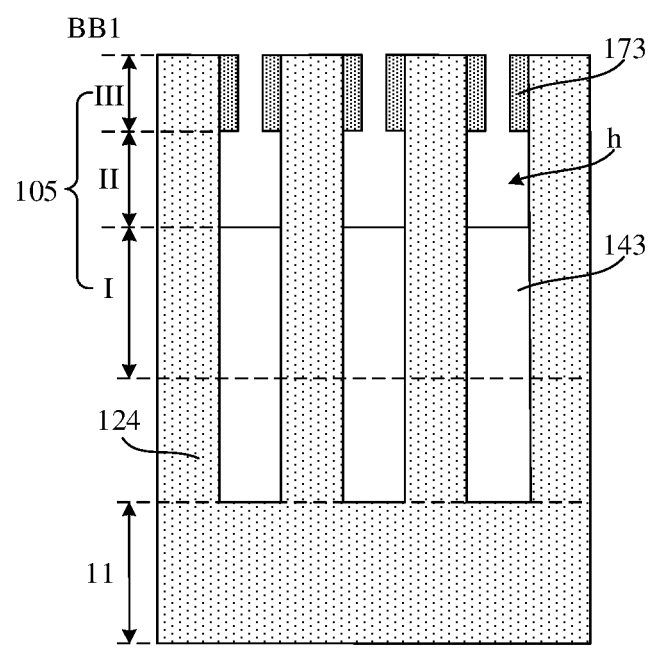

Referring to FIG. 20 to FIG. 22 together, the initial first isolation layer 113a located on the sidewalls of each channel region II that is exposed by the through via f is removed, and the remaining initial first isolation layer 113a (referring to FIG. 18) serves as the first isolation layer 113.

Each through via f exposes a partial top surface of each initial first isolation layer 113a, and the material of the initial first isolation layers 113a is different from both the material of the second isolation layers 163 and the material of the third isolation layers 173. Therefore, an etchant may be injected in the through via f, to remove the initial first isolation layer 113a located on the sidewalls of the channel region II i by a wet etching process. The initial first isolation layer 113a located on the sidewalls of the first doped region I is retained as the first isolation layer 113.

In addition, the second isolation layers 163 and the third isolation layers 173 jointly form a support frame. The support frame is in contact connection with the second doped regions III, and a part of the support frame is embedded in the first isolation layers 113. In the step of performing a wet etching process, in one aspect, the support frame supports and fastens the semiconductor channels 105, so that when the etchant flows to exert a pressing force to the semiconductor channels 105, the semiconductor channels 105 are prevented from being pressed and thus prevented from tilting or deviating, thereby improving the stability of the semiconductor structure. In another aspect, the support frame surrounds the sidewalls of the second doped regions III, which helps to prevent the etchant from causing damage to the second doped regions III.

After the initial first isolation layer 113a located on the sidewalls of the channel region II is removed, a second space g is formed between the channel region II and the second isolation layer 163. The through via f and the second space g jointly form a cave structure h.

Figure 23:
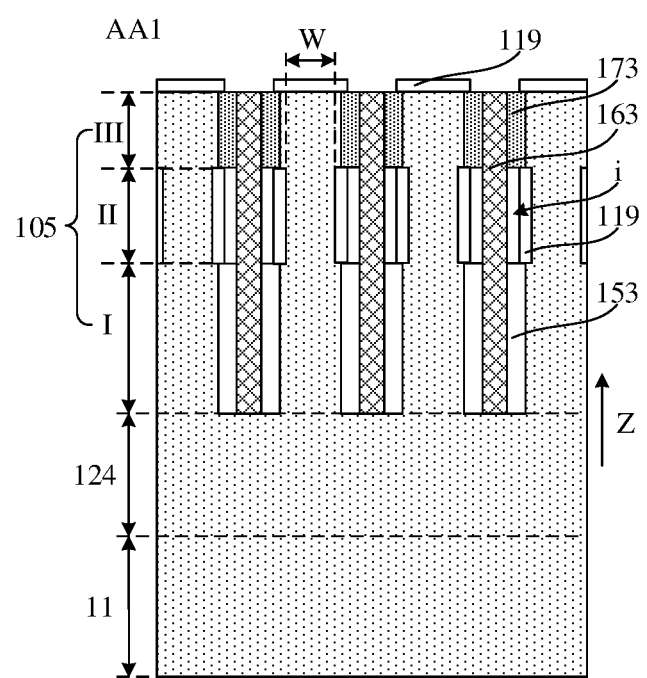
Figure 24:
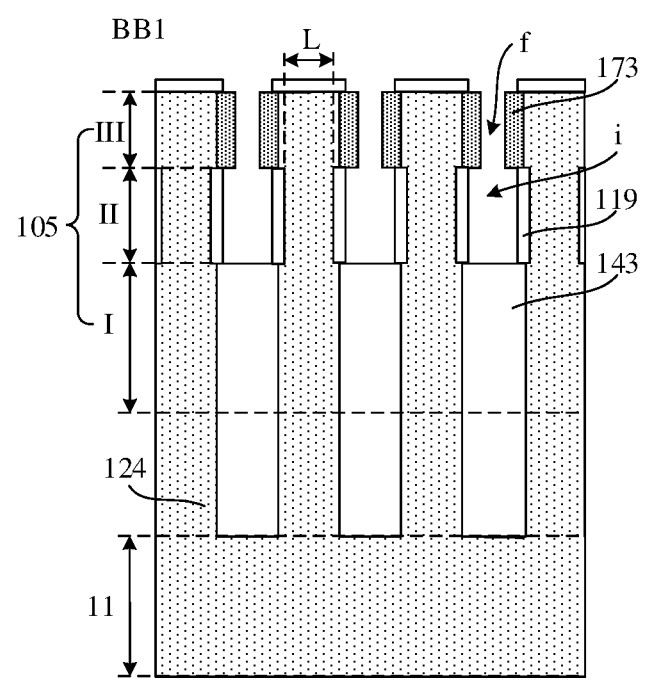

Referring to FIG. 23 and FIG. 24, protection layers 119 are formed on sidewall surfaces of the channel regions II. The protection layers 119 cover the sidewall surfaces of the channel regions II, respectively.

In an example where the material of the semiconductor channels 105 is silicon, a thermal oxidation treatment is performed on the exposed sidewalls of the channel regions II, to form the protection layers 119, which cover sidewall surfaces of the remaining channel regions II. Fifth intervals i are provided between the protection layers 119 and the second isolation layers 163. Specifically, in a direction perpendicular to the sidewalls of the channel regions II, a thickness of the protection layers 119 is 1 nm to 2 nm. In other embodiments, the protection layers may be formed by a deposition process.

In one aspect, during subsequent formation of a sacrifice layer, the protection layers 119 are used for isolating the sacrifice layers from the channel regions II, to avoid contaminating the channel regions II during the formation of the sacrifice layers. In another aspect, during subsequent removal of the sacrifice layers and the protection layers 119, the protection layers 119 are used as an etch buffer, to prevent the sidewalls of the channel regions II from being excessively etched.

In the process of the thermal oxidation process, the top surfaces of the second doped regions III are also exposed, so that the regions of the second doped regions III close to their top surfaces of and the sidewalls of the channel regions II are all converted into the protection layers 119.

Figure 25:
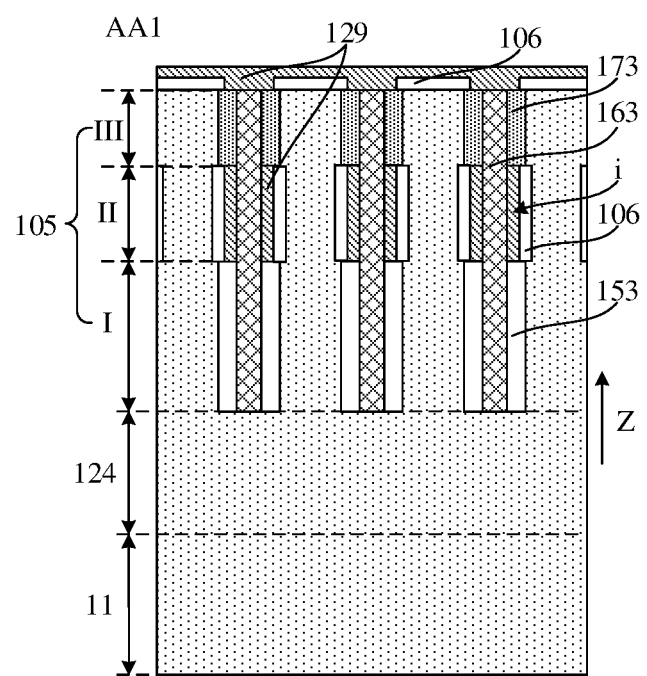
Figure 26:
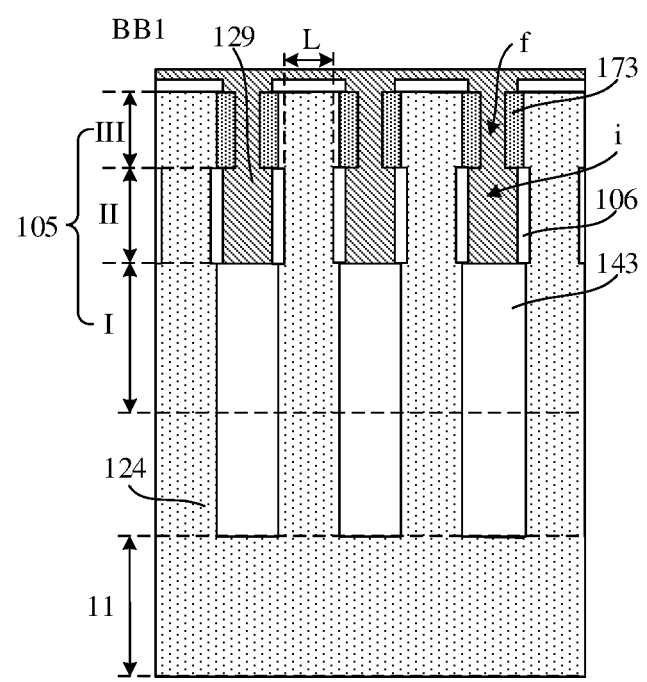

Referring to FIG. 25 and FIG. 26, a sacrifice layer 129 doped with the second-type doped ions is formed on sidewalls of each of the protection layers 119 away from the correspond channel region II, in which the sacrifice layer 129 at least covers the sidewalls of the channel region II.

In some embodiments, the sacrifice layer 129 that completely fills the through vias f and the fifth intervals i may be formed by a deposition process. That is, the sacrifice layer 129 completely fills intervals between adjacent protection layers 119, and is located in intervals between adjacent second doped regions III. In this way, the formed sacrifice layer 129 has a relatively large volume, so that during a subsequent annealing process, more second-type doped ions can be provided, to enable more second-type doped ions to be diffused into the channel regions II, thereby reducing a concentration of majority carriers in the channel regions II.

The material of the sacrifice layer 129 includes polycrystalline silicon. Polycrystalline silicon contains many impurities. Therefore, during the formation of polycrystalline silicon, the protection layers 119 provided between the channel regions II and the sacrifice layers 129 help to prevent the channel regions II from being contaminated by impurities. The second-type doped ions may be boron ions.

In some embodiments, a doping concentration of the second-type doped ions in the sacrifice layers 129 is $4 \times 10^{20}$ atom/cm$^3$ to $9 \times 10^{20}$ atom/cm$^3$. For example, the doping concentration of the second-type doped ions in the sacrifice layers 129 is $1 \times 10^{21}$ atom/cm$^3$, which helps to ensure that after the annealing process is performed subsequently, a range of an effective doping concentration of the first-type doped ions in the channel regions II is $8 \times 10^{18}$ atom/cm$^3$ to $2 \times 10^{19}$ atom/cm$^3$.

In other embodiments, instead of forming protection layers on the sidewalls of the channel regions, sacrifice layers doped with the second-type doped ions may be directly formed on the sidewall surfaces of the channel regions.

The second-type doped ions are diffused into the channel regions II by using the annealing process, thereby reducing the concentration of majority carriers in the channel regions II. The first doped regions I, the channel regions II, and the second doped regions III are all doped with the first-type doped ions in the foregoing process. Therefore, when the second-type doped ions are diffused into the channel regions II, the effective doping concentration of the first-type doped ions in the channel regions II is less than that in the first doped regions I and the second doped regions III, enabling the concentration of majority carriers in the channel region II to be less than that in the first doped regions I the second doped regions III. As a result, while the on/off ratio of the channel regions II is increased, a threshold voltage of a transistor formed by the first doped region I, the channel region II, and the second doped region III is reduced and a saturation current of the transistor is increased.

In addition, in the step of the annealing process, a diffusion direction of the second-type doped ions is from the channel regions II to the first doped regions I or from the channel regions II to the second doped regions III. In this way, an effective doping concentration of the first-type doped ions in partial regions of the first doped regions I contacting a channel region II decreases, and an effective doping concentration of the first-type doped ions in partial regions of the second doped regions III contacting the channel region II decreases, which makes the semiconductor structure less affected by collisional ionization and reduces GIDL.

In addition, the sidewalls of the second doped regions III are protected by the third isolation layers 173 and the top surfaces of the second doped regions III are protected by the protection layers 119. Therefore, the second-type doped ions may be diffused in the channel regions II by directly performing an annealing process without the need to etch the sacrifice layers 129, which helps to simplify the step of manufacturing the semiconductor structure.

Figure 27:
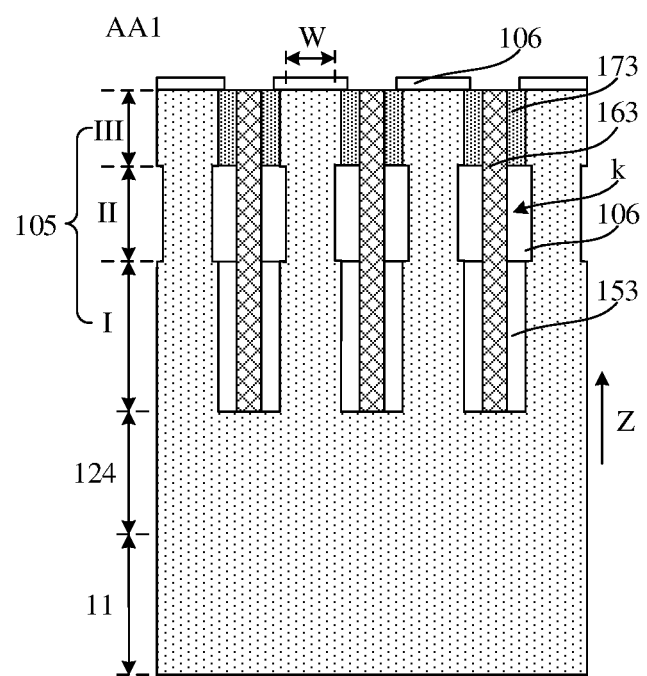
Figure 28:
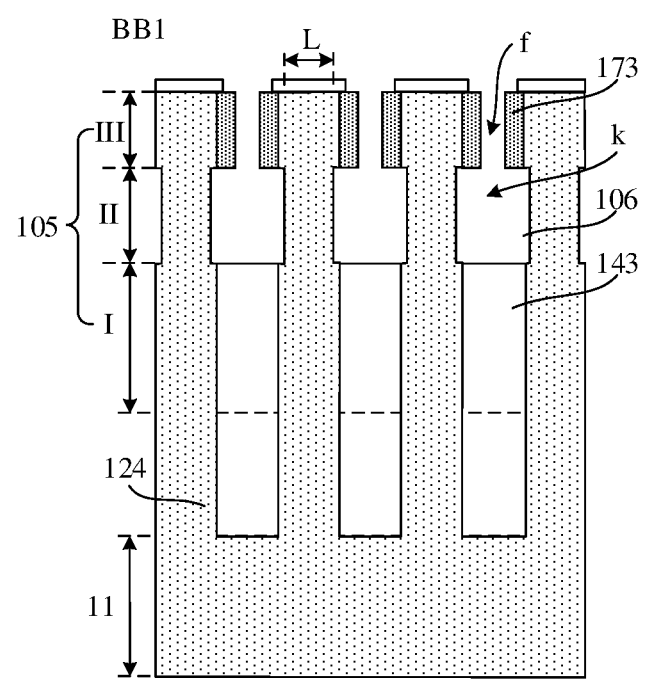

Referring to FIG. 27 and FIG. 28, the sacrifice layers 129 and the protection layers 119 are removed, to expose the sidewalls of the channel regions II, and form through vias f and second intervals k with a larger volume again. Moreover, the area of the orthographic projection of each channel region II onto the base 11 is enabled to be smaller than the area of the orthographic projection of each second doped region III onto the base 11 and smaller than the area of the orthographic projection of each first doped region I onto the base 11. In this embodiment, the material of the sacrifice layers 129 is polycrystalline silicon, the material of the channel regions II is silicon, and thus a difference between rates of etching the sacrifice layers 129 and the channel regions II in the same etching process is relatively small. Therefore, during the removal of the sacrifice layers 129, the protection layers 119 may serve as an etch barrier layer, thereby preventing the channel regions II from being damaged by etching.

Figure 29:
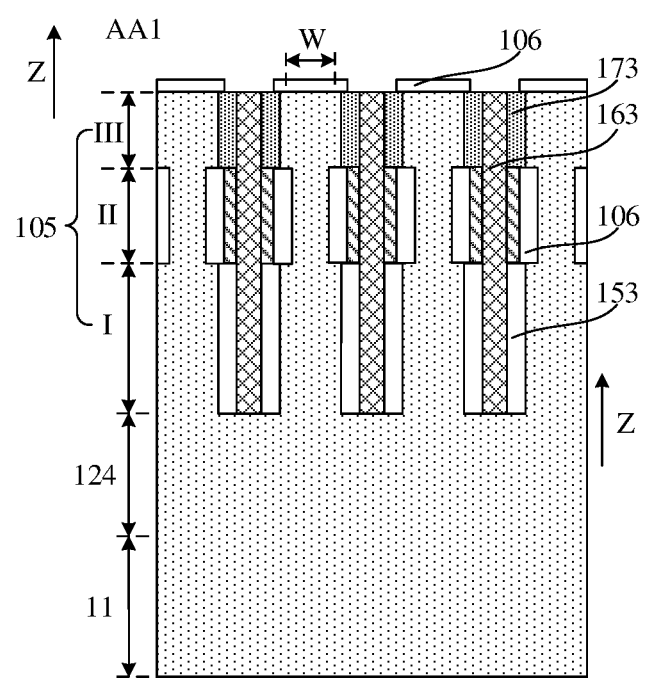
Figure 30:
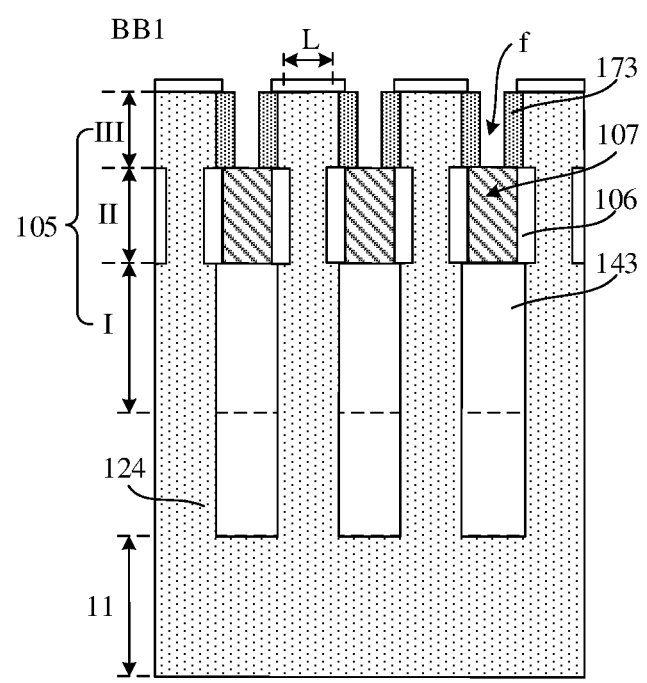
Figure 31:
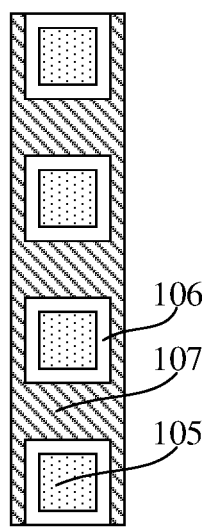

Referring to FIG. 29 to FIG. 31, the insulating layers 106 covering the sidewall surfaces of the channel regions II are formed. The word lines 107 covering sidewall surfaces of the insulating layers 106 away from the channel regions II are formed. The word lines 107 and the insulating layers 106 jointly completely fill the second intervals k (referring to FIG. 28).

In some embodiments, a thermal oxidation process is performed on the exposed sidewalls of the channel regions II, to form the insulating layers 106, further making the area of the orthographic projection of each channel region II onto the base 11 less than the area of the orthographic projection of each second doped region III onto the base 11 and less than the area of the orthographic projection of each first doped region I onto the base 11. Thus, the channel regions II with a smaller cross-sectional area in a cross-section perpendicular to the direction Z is allowed to be formed without using an etching process, which helps to improve the controllability of the word lines 107 on the channel regions II, making it easier to control the on or off of the GAA transistor. The material of the insulating layers 106 is silicon oxide. In other embodiments, the insulating layers covering the sidewall surfaces of the channel regions may be formed by a deposition process.

The step of forming word lines 107 includes: forming initial word lines, which respectively completely fill the second intervals k and the through vias f; and removing the initial word lines located in the through vias f, thus the remaining initial word lines serve as the word lines 107. The initial word lines may be formed by a deposition process. The material of the initial word lines includes at least one of polycrystalline silicon, titanium nitride, tantalum nitride, copper, or tungsten.

The initial word lines completely fill the second intervals k and the through vias f in a self-aligned manner, to facilitate the self-aligned formation of the word lines 107 with an accurate size after the initial word lines located in the through vias f are removed. Therefore, it is not necessary to design a size of the word lines 107 by an etching process, which helps to simplify the steps of forming the word lines 107, and a small-sized word line 107 may be obtained by regulating the size of a second interval k.

Figure 32:
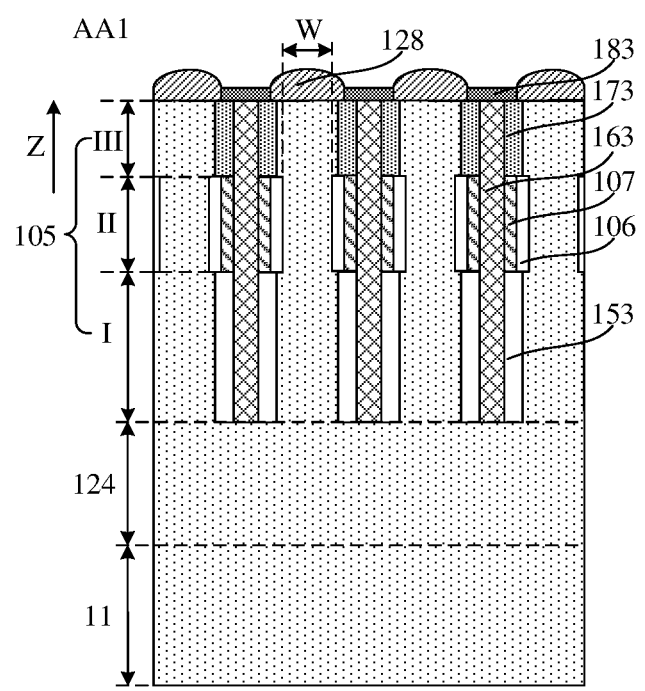

Referring to FIG. 32, after forming word lines 107, fourth isolation layers 183 are further formed. The fourth isolation layers 183 completely fill the through vias f (referring to FIG. 30).

In some embodiments, the material of the fourth isolation layers 183 is the same the materials of the second isolation layers 163 and the third isolation layers 173, all including silicon nitride. In other embodiments, a chemical-mechanical planarization process may be performed on the third isolation film to expose the top surfaces of the second doped regions. That is, the insulating layers located in the top surfaces of the second doped regions are synchronously removed, and the remaining third isolation film serves as the third isolation layers.

Referring to FIG. 32 again, the insulating layers 106 located on the top surfaces of the second doped regions III are removed (referring to FIG. 29). Initial transition layers 128 are formed on the top surfaces of the second doped regions III by an epitaxial growth process, in which an orthographic projection of each initial transition layer 128 onto the base 11 covers the orthographic projection of each second doped region III onto the base 11.

In addition, in a process step of epitaxial growth, the initial transition layers 128 are further doped with the first-type doped ions. A doping concentration of the first-type doped ions in the initial transition layers 128 is greater than that in the second doped regions III, so that a resistance of the initial transition layers 128 is less than that of the second doped regions III.

In one aspect, the use of the epitaxial growth process helps to improve the continuity between the second doped regions III and the initial transition layers 128, so as to reduce contact defects caused by different lattice properties or lattice misalignment, so that a contact resistance caused by contact defects is reduced, and thus a transmission capability and a movement speed of carriers are improved, thereby improving the electrical conductivity between the second doped regions III and the initial transition layers 128, and reducing heat generated in a running process of the semiconductor structure. In another aspect, the use of the epitaxial growth process helps to increase the orthographic projection of the initial transition layers 128 onto the base 11, so that an area of the orthographic projection of the initial transition layers 128 onto the base 11 is greater than an area of the orthographic projection of the second doped regions III onto the base 11. Thus, the initial transition layers 128 may serve as a mask subsequently, to prevent second dielectric layers formed surrounding the sidewalls of the second doped regions III from being etched to expose the second doped regions III, ensuring the good protection of the second doped regions III by the subsequently formed second dielectric layers.

Figure 33:
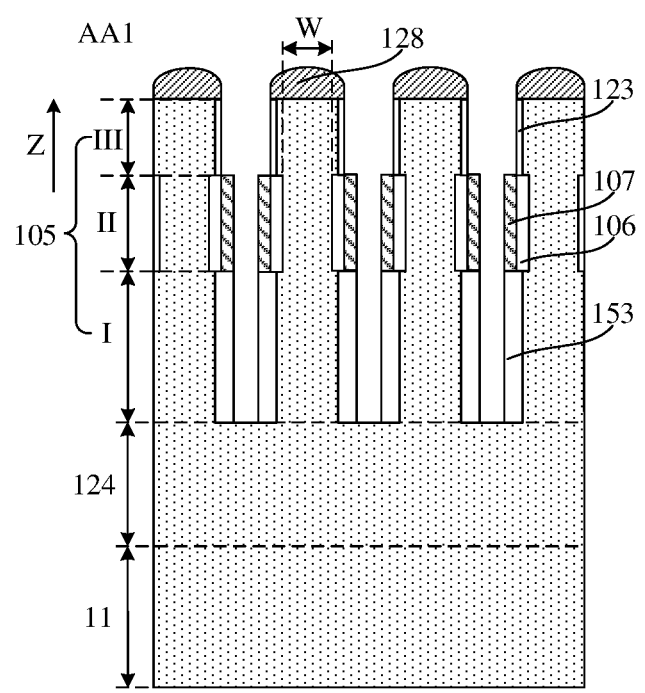

Referring to FIG. 32 and FIG. 33 together, the second isolation layers 163, the third isolation layers 173, and the fourth isolation layers 183 are etched with the initial transition layers 128 as a mask, to expose the sidewalls of the second doped regions III., Top surfaces of the remaining second isolation layers 163 is not higher than top surfaces of the word lines 107. The orthographic projection of each initial transition layer 128 onto the base 11 covers the orthographic projection of each second doped region III onto the base 11, to help to prevent the semiconductor channels 105 from being damaged by etching in the step.

Next, a second dielectric film that conformally covers of surfaces of the initial transition layers 128, the sidewalls of the second doped regions III, the top surfaces of the word line 107, and top surfaces of the second isolation layers 163 is formed. The chemical-mechanical planarization process is performed on the second dielectric film to expose the surfaces of the initial transition layers 128. The remaining second dielectric film is etched with the initial transition layers 128 as a mask. The area of the orthographic projection of the initial transition layers 128 onto the base 11 is greater than the area of the orthographic projection of the second doped regions III onto the base 11. Therefore, while the second medium film located on the surfaces of the initial transition layers 128, the top surfaces of the second isolation layers 163, and a partial top surfaces of the word lines 107 is removed, the second dielectric film right opposite the orthographic projection of each of the initial transition layers 128 onto the base 11 can be prevented from being etched, so as to form a second dielectric layer 123 surrounding the sidewalls of each of the second doped regions III, to ensure good protection of the second doped region III by the second dielectric layer 123. The second dielectric film may be formed by a deposition process.

Then, the remaining second isolation layers 163 are removed, to expose top surfaces of the initial bit lines 124.

In other embodiments, the second isolation layer, the third isolation layer and the fourth isolation layer are etched with the initial transition layers as a mask, to expose the initial bit line and the sidewalls of the second doped region; and then the thermal oxidation process is performed on an exposed sidewalls of the second doped region, to form the second dielectric layer.

Referring to FIG. 33 and FIG. 1 to FIG. 5 together, the exposed initial bit lines 124 and the initial transition layers 128 are metallized, to form the bit lines 104. The material of the bit lines 104 includes a metal semiconductor compound 114.

The metallization includes the following steps.

A metal layer is formed on the surfaces of the initial transition layers 128 and the top surfaces of the initial bit lines 124. The metal layer provides a metal element for forming the bit line 104. The metal layer is also located on exposed surfaces of the second dielectric layers 123, the word lines 107 and the first isolation layers 113. The material of the metal layer includes at least one of cobalt, nickel, molybdenum, titanium, tungsten, tantalum, or platinum.

The annealing process is performed, to convert partial thicknesses of the initial transition layers 128 into a metal contact layer 108 and partial thicknesses of the initial bit lines 124 into the bit lines 104. After the bit lines 104 are formed, the remaining metal layer is removed.

In some embodiments, in the annealing process, the metal layer reacts with each initial transition layer 128 and each initial bit line 124 to convert the partial thickness of the initial transition layer 128 into the metal contact layer 108, and the partial thickness of the initial bit line 124 into the bit line 104. Specifically, in an example, referring to FIG. 3, a plurality of metal semiconductor compounds 114 in a same bit line 104 are disposed at intervals from each other. In still another example, referring to FIG. 4, the plurality of metal semiconductor compounds 114 in a same bit line 104 are in communication with each other.

In other embodiments, the full thickness of the initial transition layers may be converted into a metal contact layer, and the full thickness of the initial bit lines may be converted into the bit lines.

In other embodiments, when the initial transition layers is not formed on the top surfaces of the second doped regions, the insulating layer located on the top surface of the second doped region is not removed, until only the initial bit lines are metallized subsequently to form the bit lines. Alternatively, when the initial transition layers are not formed on the top surfaces of the second doped regions, the insulating layers located on the top surfaces of the second doped regions is removed and the sidewalls of the second doped regions is exposed, then the second dielectric film that conformally covers the top surfaces and the sidewalls of the second doped regions, the top surfaces of the word lines and the top surfaces of the second isolation layers are formed, and then the second dielectric film is vertically etched, to remove the second dielectric film located on the top surfaces of the second doped regions, the top surfaces of the second isolation layers, and the partial top surfaces of the word lines, and thus the second dielectric film located on the sidewalls of the second doped regions is retained as the second dielectric layer.

Referring to FIG. 33 and FIG. 1 to FIG. 5 again, third dielectric layers 133 are formed. Each of the third dielectric layers 133 fills the first interval between two adjacent ones of the first isolation layers 113, the second gap between two adjacent ones of the word lines 107, and the third gap between two adjacent ones of the second dielectric layers 123 for achieving electrical insulation between adjacent semiconductor channels 105 and between adjacent word lines 107. In some examples, referring to FIG. 6, during the formation of the third dielectric layer 133, the third dielectric layer 133 located in the second gap may further have a fourth gap 109.

The second dielectric layer 123, the third dielectric layer 133, the fourth dielectric layer 143, and the fifth dielectric layer 153 jointly form the isolation layer 103.

In still some other embodiments, referring to FIG. 11 to FIG. 14 and FIG. 34 to FIG. 36 together, the forming the first isolation layers 113, the insulating layers 106, the word lines 107, and the third dielectric layers 133 includes the following steps.

Referring to FIG. 11 to FIG. 14, the initial first isolation layers 113a are formed. Each of the initial first isolation layers 113a surrounds the sidewalls of each of the semiconductor channels 105, and the fourth interval e is provided between the initial first isolation layers 113a respectively located on sidewalls of two adjacent ones of the semiconductor channels 105 on a same initial bit line 124. The second isolation layer 163 is formed, which completely fills the fourth interval e. The material of the second isolation layer 163 is different from that of the initial first isolation layer 113a.

The steps of forming the initial first isolation layers 113a and the second isolation layers 163 are the same as those in the foregoing examples. Details are not described herein again.

Figure 34:
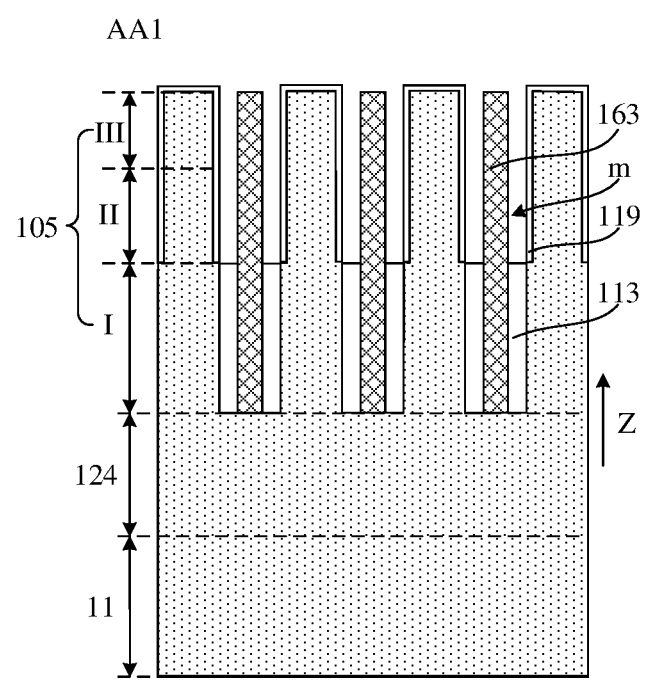

Referring to FIG. 34, the partial initial first isolation layer 113a (referring to FIG. 14) is etched to expose the sidewalls of the second doped region III and the sidewalls of the channel region II, and the remaining initial first isolation layer 113a is used as the first isolation layer 113. Further, the protection layers 119 covering the sidewalls of the second doped regions III and the sidewalls of the channel region II is formed, in which a sixth interval m is provided between the protection layer 119 and the second isolation layer 163.

In an example where the material of the semiconductor channels 105 is silicon, the thermal oxidation process is performed on the exposed sidewalls of the second doped regions III and the exposed sidewalls of the channel regions II, to form the protection layers 119 that cover sidewall surfaces of the remaining second doped regions III and the sidewall surfaces of the remaining channel regions II. Specifically, in a direction perpendicular to the direction Z, the thickness of the protection layers 119 is 1 nm to 2 nm. In other embodiments, the protection layers may be formed by a deposition process.

In one aspect, during subsequent formation of the sacrifice layers, the protection layers 119 are used for isolating the sacrifice layers from the channel regions II, to avoid contaminating the channel regions II during the formation of the sacrifice layers. In another aspect, during subsequent removal of the sacrifice layers and the protection layers 119, the protection layers 119 is used as an etch buffer, to prevent the sidewalls of the channel regions II from being excessively etched.

In the thermal oxidation process, the partial regions of the second doped regions III close to their top surfaces are also converted into the protection layer 119 as the top surfaces of the second doped regions III are also exposed.

Figure 35:
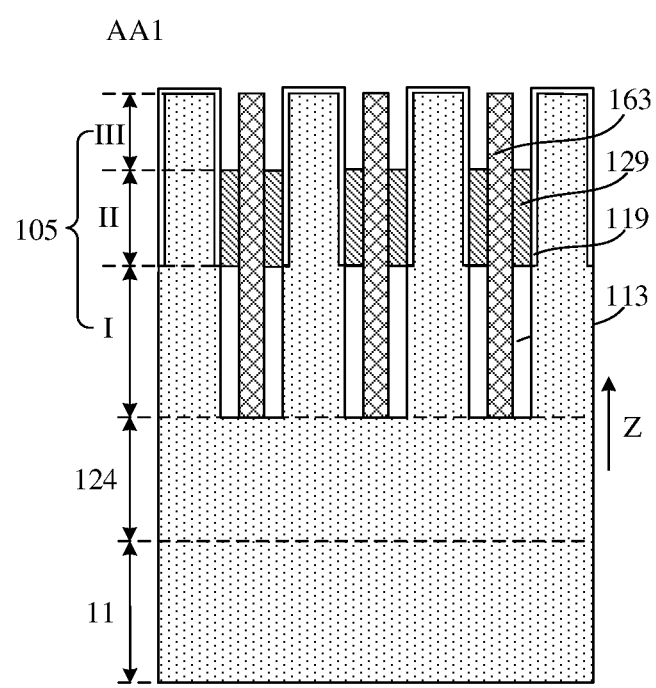

Referring to FIG. 35, sacrifice layers 129 doped with the second-type doped ions are formed on the sidewalls of the protection layers 119 away from the channel regions II, in which each of the sacrifice layers 129 only covers the sidewalls of the channel region II. The step of forming each sacrifice layer 129 may include: forming an initial sacrifice layer completely filling the sixth interval m by a deposition process; and etching back the initial sacrifice layer, to remove a part of the initial sacrifice layer until the initial sacrifice layer is only located on the sidewalls of the channel region II. In this way, the second-type doped ions can be prevented from being diffused into the second doped region III through the protection layer 119 surrounding the sidewalls of the second doped region III during a subsequent annealing process.

The second-type doped ions are diffused into the channel regions II by the annealing process, to reduce the concentration of majority carriers in the channel regions II.

Figure 36:
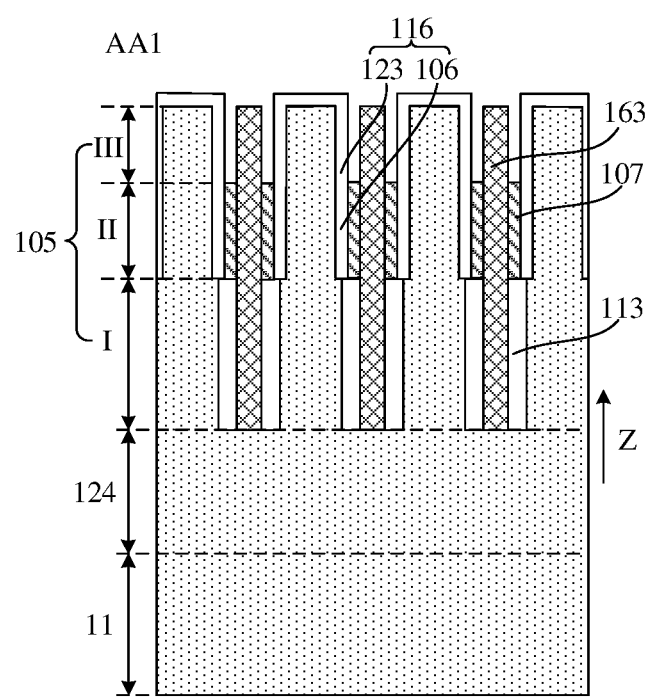

Referring to FIG. 35 and FIG. 36 together, the protection layer 119 and the sacrifice layer 129 are removed, to expose the sidewalls of the second doped region III and the sidewalls of the channel region II. Initial insulating layer 116 covering the sidewalls of the second doped region III and the sidewalls of the channel region II is formed. A gap is provided between the initial insulating layer 116 and the second isolation layer 163. The initial insulating layer 116 on the sidewalls of the channel region II is the insulating layer 106, and the protection layer 119 covering the sidewalls of the second doped region III is the second dielectric layer 123. A method for forming the initial insulating layers 116 includes a thermal oxidation process or a deposition process.

In some embodiments, the initial insulating layers 116 located on top surfaces of the remaining second doped regions III are removed in subsequent process steps. In other embodiments, the initial insulating layers located on the remaining top surfaces of the second doped regions may be removed after the thermal oxidation process, and only the initial insulating layers covering the sidewall surfaces of the remaining channel regions and the remaining second doped regions are retained.

Word lines 107 are formed. Each of the word line 107 only surrounds sidewalls of the insulating layer 106 located on the sidewalls of the channel region II. The step for forming the word lines 107 is the same as that in the foregoing example. Details are not described herein again.

The steps of forming the fourth isolation layers, forming the initial transition layers, metallizing the initial transition layers and the initial bit lines to form the metal contact layers and the bit lines, and forming the third dielectric layers after forming the word lines 107 are the same as those in the foregoing examples. Details are not described herein again.

A surface formed jointly by the metal contact layers 108 and the third dielectric layers 133 form a capacitor structure (not shown in the figures). In other embodiments, metal contact layers may be not formed. After the insulating layers located on the top surfaces of the second doped regions are removed, a capacitor structure is formed directly on a surface formed jointly by the second doped regions and the third dielectric layers.

In summary, a hole structure with a specific shape is formed, and a thermal oxidation process and an annealing process are used to diffuse the second-type doped ions into a channel region II that is already doped with the first-type doped ions, enabling the effective doping concentration of the first-type doped ions in the channel regions II to be less than those in the first doped regions I and the second doped regions III. In this way, while the concentration of majority carriers in the channel region II is enabled to be relatively low, it is ensured that the concentrations of majority carriers in the first doped region I and the second doped region III are relatively high, so that while the on/off ratio of the channel region II is increased, the threshold voltage of the transistor formed by the first doped region I, the channel region II, and the second doped region III is reduced and the saturation current of the transistor is increased, thereby improving the electrical performance of a semiconductor structure.

A person of ordinary skill in the art may understand that the foregoing implementation modes are specific embodiments for implementing the disclosure, and in actual applications, various changes can be made thereto in forms and details without departing from the spirit and scope of the disclosure. Any person skilled in the art can make changes and modifications without departing from the spirit and scope of the disclosure. Therefore, the scope of protection of the disclosure should be as defined by the scope of the claims.

The invention claimed is:

1. A semiconductor structure, comprising:
a base;
a bit line, located on the base; and
a semiconductor channel, located on a surface of the bit line, wherein in a direction from the base to the bit line, the semiconductor channel comprises a first doped region, a channel region, and a second doped region that are sequentially arranged, wherein the first doped region contacts the bit line, and the first doped region, the channel region, and the second doped region are doped with first-type doped ions, the channel region is further doped with second-type doped ions, enabling a concentration of majority carriers in the channel region to be less than concentrations of majority carriers in the first doped region and the second doped region, the first-type doped ions being one of N-type ions or P-type ions, and the second-type doped ions being the other of N-type ions or P-type ions.

2. The semiconductor structure according to claim 1, wherein the second-type doped ions are also located in a region of the first doped region close to the channel region and a region of the second doped region close to the channel region.

3. The semiconductor structure according to claim 1, wherein an effective doping concentration of the first-type doped ions in the channel region is less than an effective doping concentration of the first-type doped ions in the first doped region, and the effective doping concentration of the first-type doped ions in the channel region is less than an effective doping concentration of the first-type doped ions in the second doped region.

4. The semiconductor structure according to claim 3, wherein the effective doping concentration of the first-type doped ions in the channel region is $8\times10^{18}$ atom/cm$^3$ to $2\times10^{19}$ atom/cm$^3$.

5. The semiconductor structure according to claim 3, wherein the effective doping concentration of the first-type doped ions in the first doped region is $3\times10^{19}$ atom/cm$^3$ to $1\times10^{20}$ atom/cm$^3$, and the effective doping concentration of the first-type doped ions in the second doped region is $3\times10^{19}$ atom/cm$^3$ to $1\times10^{20}$ atom/cm$^3$.

6. The semiconductor structure according to claim 1, wherein an area of an orthographic projection of the channel region onto the base is smaller than an area of an orthographic projection of the second doped region onto the base and an area of an orthographic projection of the first doped region onto the base.

7. The semiconductor structure according to claim 1, wherein the base, the bit line, and the semiconductor channel have a same semiconductor element.

8. The semiconductor structure according to claim 7, wherein a material of the bit line further comprises a metal semiconductor compound.

9. The semiconductor structure according to claim 8, further comprising: a metal contact layer, located on a top surface of the second doped region away from the base, wherein the metal semiconductor compound and the metal contact layer have a same metal element.

10. The semiconductor structure according to claim 1, further comprising:
an insulating layer, covering sidewall surfaces of the channel region;
a word line, covering sidewall surfaces of the insulating layer away from the channel region, wherein sidewalls of two adjacent ones of the first doped regions, sidewalls of two adjacent ones of the word lines and sidewalls of adjacent second doped regions define a gap; and
an isolation layer, located in the gap, wherein a top surface of the isolation layer away from the base is not lower than top surfaces of the second doped regions away from the base.

11. A method for manufacturing a semiconductor structure, comprising:
providing a base;
forming an initial bit line on the base, and forming a semiconductor channel on a surface of the initial bit line away from the base, wherein in a direction from the base to the initial bit line, the semiconductor channel comprises a first doped region, a channel region, and a second doped region that are sequentially arranged, and are doped with first-type doped ions at a same doping concentration, wherein the first-type doped ions are one of N-type ions or P-type ions;
forming a sacrifice layer doped with second-type doped ions, wherein the sacrifice layer at least covers the sidewall of the channel region, and the second-type doped ions are the other of N-type ions or P-type ions;
diffusing the second-type doped ions into the channel region by an annealing process, to reduce a concentration of majority carriers in the channel region; and
removing the sacrifice layer, to expose the sidewall of the channel region.

12. The method according to claim 11, wherein a doping concentration of the second-type doped ions in the sacrifice layer is $4\times10^{20}$ atom/cm$^3$ to $9\times10^{20}$ atom/cm$^3$.

13. The method according to claim 11, further comprising: before forming the sacrifice layer doped with second-type doped ions on the sidewall of the channel region,
forming a protection layer on a sidewall surface of the channel region, wherein the protection layer covers the sidewall surface of the channel region; and
further comprising: after removing the sacrifice layer, removing the protection layer.

14. The method according to claim 13, wherein the sacrifice layer completely fills an interval between two adjacent ones of the protection layers, and is located in an interval between two adjacent ones of the second doped regions.

15. The method according to claim 11, wherein in the step of the annealing process, a diffusion direction of the second-type doped ions is from the channel region to the first doped region or from the channel region to the second doped region.

16. The method according to claim 11, further comprising: before forming the sacrifice layer doped with second-type doped ions on the sidewall of the channel region,
forming first isolation layers, each covering sidewall surface of each first doped region, wherein a first interval is provided between first isolation layers on sidewalls of two adjacent ones of the first doped regions on a same initial bit line, and the first interval exposes the initial bit line;
forming a second isolation layer, located in the first interval, a top surface of which away from the base is not lower than a top surface of the second doped region away from the base wherein a second interval is provided between the second isolation layer and the channel region; and forming a third isolation layer covering a sidewall surface of the second doped region, wherein the third isolation layer contacts the second isolation layer, a third interval is provided between second isolation layers located on sidewalls of two adjacent ones of the second doped regions on two adjacent ones of the initial bit lines, wherein the second interval is in communication with the third interval.

17. The method according to claim 16, further comprising: after removing the sacrifice layer,
    forming an insulating layer covering the sidewall surface of the channel region; and
    forming a word line covering a sidewall surface of the insulating layer away from the channel region, wherein the word line and the insulating layer jointly completely fill the second interval.

18. The method according to claim 17, further comprising: after forming the word line,
    removing the second isolation layer and the third isolation layer, to expose the initial bit line; and
    metallizing the exposed initial bit line, to form the bit line, wherein a material of the bit line comprises a metal semiconductor compound.

19. The method according to claim 18, further comprising: after forming the word line and before removing the second isolation layer and the third isolation layer,
    forming an initial transition layer on a top surface of the second doped region away from the base by an epitaxial growth process, wherein the initial transition layer is doped with the first-type doped ions, a doping concentration of which in the initial transition layer is greater than an effective doping concentration of the first-type doped ions in the second doped region, and an orthographic projection of the initial transition layer onto the base covers an orthographic projection of the second doped region onto the base.

20. The method according to claim 19, wherein the step of metallizing the initial bit line further comprises: metallizing the initial transition layer.

* * * * *